United States Patent
Yamada et al.

(10) Patent No.: US 7,095,081 B2
(45) Date of Patent: Aug. 22, 2006

(54) SEMICONDUCTOR DEVICE AND MANUFACTURING METHOD THEREOF

(75) Inventors: Takashi Yamada, Ebina (JP); Hajime Nagano, Yokohama (JP); Takeshi Hamamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/331,316

(22) Filed: Jan. 13, 2006

(65) Prior Publication Data

US 2006/0118873 A1 Jun. 8, 2006

Related U.S. Application Data

(62) Division of application No. 10/699,676, filed on Nov. 4, 2003.

(30) Foreign Application Priority Data

Aug. 28, 2003 (JP) ............... 2003-209311

(51) Int. Cl.
*H01L 27/01* (2006.01)
*H01L 27/12* (2006.01)
*H01L 31/0392* (2006.01)
*H01L 29/00* (2006.01)

(52) U.S. Cl. ............... 257/347; 257/350; 257/351; 257/506; 257/510

(58) Field of Classification Search ........ 257/347–351, 257/506–510
See application file for complete search history.

(56) References Cited

U.S. PATENT DOCUMENTS

| | | | |
|---|---|---|---|
| 6,214,653 | B1 | 4/2001 | Chen et al. |
| 6,214,694 | B1 | 4/2001 | Leobandung et al. |
| 6,429,488 | B1 | 8/2002 | Leobandung et al. |
| 6,531,754 | B1 | 3/2003 | Nagano et al. |
| 6,630,714 | B1 | 10/2003 | Sato et al. |
| 6,750,486 | B1 | 6/2004 | Sugawara et al. |
| 6,835,981 | B1 | 12/2004 | Yamada et al. |
| 6,855,976 | B1 | 2/2005 | Nagano et al. |
| 2003/0057490 | A1 | 3/2003 | Nagano et al. |
| 2003/0151112 | A1 | 8/2003 | Yamada et al. |
| 2004/0150044 | A1 | 8/2004 | Nagano et al. |
| 2004/0183131 | A1 | 9/2004 | Nagano et al. |

FOREIGN PATENT DOCUMENTS

| JP | 7-106434 | 4/1995 |
|---|---|---|
| JP | 8-17694 | 1/1996 |
| JP | 8-316431 | 11/1996 |

(Continued)

OTHER PUBLICATIONS

Robert Hannon, et al., "0.25 μm Merged Bulk DRAM and SOI Logic using Patterned SOI", Symposium on VLSI Technology Digest of Technical Papers, 2000, pp. 66-67.

(Continued)

*Primary Examiner*—Cuong Nguyen
(74) *Attorney, Agent, or Firm*—Oblon, Spivak, McClelland, Maier & Neustadt, P.C.

(57) ABSTRACT

A semiconductor device includes a substrate having first to fourth regions, a first insulating film formed on the substrate in the first region, a first epitaxial layer formed on the substrate in the second region and having an upper surface higher than an upper surface of the first insulating film, a first semiconductor layer formed on the first insulating film with a space provided with respect to the first epitaxial layer and having an upper surface set at substantially the same height as the upper surface of the first epitaxial layer, and an element isolation insulating film formed in the space and having an upper surface set at substantially the same height as the upper surface of the first epitaxial layer and the upper surface of the first semiconductor layer.

3 Claims, 16 Drawing Sheets

FOREIGN PATENT DOCUMENTS

| | | |
|---|---|---|
| JP | 10-303385 | 11/1998 |
| JP | 11-17001 | 1/1999 |
| JP | 11-238860 | 8/1999 |
| JP | 2000-91534 | 6/2000 |
| JP | 2000-243944 | 9/2000 |

OTHER PUBLICATIONS

H. L. Ho, et al., "0.13 μm High-Performance SOI Logic Technology with Embedded DRAM for System-On-A-Chip Application", IEDM Tech, Dig. 2001, pp. 503-506.

T. Yamada, et al., "An Embedded DRAM Technology on SOI/Bulk Hybrid Substrate Formed with SEG Process for High-End SOC Application", Symposium on VLSI Technology Digest of Technical Papers, 2002, pp. 112-113.

Hajime Nagano, et al., "SOI/Bulk Hybrid Wafer Process Using SEG (Selective Epitaxial Growth) Technique for High-End SOC Applications", Extended Abstracts of the 2002 International Conference on Solid State Devices and Materials, 2002, pp. 442-443.

Takashi Yamada, et al., "An Embedded DRAM Technology in SOI for High-End SoC Application", SEMI Technology Symposium, 2002, pp. 2-39-2-44 (with English Abstract).

SEMICONDUCTOR DEVICE AND MANUFACTURING METHOD THEREOF

CROSS-REFERENCE TO RELATED APPLICATIONS

This application is based upon and claims the benefit of priority under 35 U.S.C. § 120 from U.S. application Ser. No. 10/699,676, filed Nov. 4, 2003, and under 35 U.S.C. § 119 from Japanese Patent Application No. 2003-209311, filed Aug. 28, 2003, the entire contents of which are incorporated herein by reference.

BACKGROUND OF THE INVENTION

1. Field of the Invention

This invention relates to a semiconductor device using a hybrid wafer having an SOI (Silicon On Insulator) region and a bulk region and a manufacturing method thereof.

2. Description of the Related Art

Recently, various attempts for lowering the parasitic capacitance, lowering the power consumption of a logic circuit and enhancing the operation speed of the logic circuit have been made by using a thin film SOI (Silicon On Insulator) wafer instead of the conventional silicon wafer and forming elements on the SOI wafer. Further, microprocessors using the SOI wafers have been commercialized. In the future, it is predicted that the necessity for a system LSI using the above SOI logic as a core is increased.

However, since the potential of a body region in which the channel of a MOSFET on the SOI wafer is formed is set into an electrically floating state, a variation in the threshold voltage occurs and a leakage current caused by the circuit operation occurs due to the so-called floating body effect. Therefore, it is not suitable to apply the SOI wafer to a circuit such as cell transistors of a DRAM or paired transistors of a sense amplifier circuit or analog circuit which has a severe specification for a leakage current level or matching characteristic.

In order to solve the above problem, it is proposed to prepare a hybrid wafer having a bulk region formed on the SOI wafer and form a circuit such as a DRAM which is not suitable for the SOI wafer on the bulk region. More specifically, the following methods are provided, for example.

First, a method for selectively forming an SOI region on the bulk wafer by use of an SIMOX (Separation by IMplantation of Oxygen) using a mask pattern is provided (refer to "Jpn. Pat. Appln. KOKAI Publication No. 10-303385" and "Robert Hannon, et al., 2000 Symposium on VLSI Technology of Technical Papers, pp. 66–67").

Second, a method for laminating a wafer on a bulk wafer having a patterned insulating film thereon is provided (refer to Jpn. Pat. Appln. KOKAI Publication No. 8-316431).

Third, a method for selectively and partially etching and removing an SOI layer on the SOI wafer and a buried insulating film formed therein is provided (refer to Jpn. Pat. Appln. KOKAI Publication No. 7-106434, Jpn. Pat. Appln. KOKAI Publication No. 11-238860, and Jpn. Pat. Appln. KOKAI Publication No. 2000-91534).

Fourth, a method for depositing silicon on a supporting substrate of a bulk region by a selective epitaxial growth method and making the silicon layer flat by polishing as required in order to eliminate the difference in level caused between the SOI region and the bulk region in the third method is provided (refer to "Jpn. Pat. Appln. KOKAI Publication No. 2000-243944" and "T. Yamada, et al., 2002 Symposium on VLSI Technology of Technical Papers, pp. 112–113").

In the above various methods using the hybrid wafer, the fourth method is excellent in productivity of elements since the difference in level between the element surface of the SOI region and the element surface of the bulk region is eliminated. Further, the fourth method is a method which can flexibly cope with a case wherein the film thickness of the SOI layer or buried insulating film varies or the material of the SOI layer such as a silicon layer or SiGe layer is changed since a semiconductor device is manufactured by use of a ready-made SOI wafer.

However, the fourth method has a problem as described below. Before explaining the problem, the fourth method is specifically explained below.

First, as shown in FIG. 41, an SOI wafer having a supporting substrate 111, buried insulating film 112 and SOI layer 113 is prepared.

Then, as shown in FIG. 42, a first mask member (for example, SiN film) 114 is formed on the SOI layer 113 to protect the same. Next, the first mask member 114, SOI layer 113 and buried insulating film 112 in the bulk region are selectively etched and removed in this order. At this time, a thin buried insulating film 112' is left behind on the supporting substrate 111.

After this, as shown in FIG. 43, a second mask member (for example, SiN film) 116 for protection of the side wall of the SOI layer 113 is formed on the entire surface. Then, a spacer formed of the second mask member 116 is formed on the side surface of the SOI layer 113 by an anisotropic dry-etching process. At this time, as in the step shown in FIG. 42, a thin buried insulating film 112" is left behind on the supporting substrate 111.

Next, as shown in FIG. 44, the buried insulating films 112, 112" are removed by using an HF solution or the like without giving damage to the supporting substrate 111. In this case, since the mask members 114, 116 on the upper portion and side surface of the SOI layer 113 are insulating films of a type different from that of the buried insulating film 112, the mask members 114, 116 can be left behind even if the buried insulating films 112, 112" are removed.

Then, as shown in FIG. 45, an epitaxial layer 117 is formed as an element forming film of single crystal silicon or the like on an exposed portion of the supporting substrate 111 by use of the epitaxial growth technique. The epitaxial growth process is performed to adjust the heights of the upper surface of the epitaxial layer 117 and the upper surface of the SOI layer 113 so as to set the upper surface of the epitaxial layer 117 and the upper surface of the SOI layer 113 substantially equal in height to each other. In this case, a facet 161 is formed on the upper end portion of the epitaxial layer 117 which lies on the SOI region side.

Next, as shown in FIG. 46, the first mask member 114 is removed. At this time, the second mask member 116 formed on the side surface of the SOI layer 113 is removed together with the first mask member 114 since the second mask member 116 is formed of the same material as that of the first mask member 114. As a result, a concave portion 160 is formed in the boundary portion between the SOI region and the bulk region.

Then, as shown in FIG. 47, gate insulating films 120, 121, gate electrodes 122, 123, 131, and element isolation regions 118, 119, 130 of the STI (Shallow Trench Isolation) structure are formed.

With the fourth method of the prior art, the facet 161 and concave portion 160 are formed in the boundary portion between the SOI region and the bulk region. Therefore, in order to eliminate the facet 161 and concave portion 160, the space for the element isolation region 130 in the boundary portion between the SOI region and the bulk region is made large.

BRIEF SUMMARY OF THE INVENTION

A semiconductor device according to a first aspect of the invention comprises a substrate having first to fourth regions, a first insulating film formed on the substrate in the first region, a first epitaxial layer formed on the substrate in the second region and having an upper surface higher than the upper surface of the first insulating film, a first semiconductor layer formed on the first insulating film with a space provided with respect to the first epitaxial layer and having an upper surface set at substantially the same height as the upper surface of the first epitaxial layer, and an element isolation insulating film formed in the space and having an upper surface set at substantially the same height as the upper surface of the first epitaxial layer and the upper surface of the first semiconductor layer.

A manufacturing method of a semiconductor device according to a second aspect of the invention comprises forming a wafer including a substrate, a first insulating film formed on the substrate and a semiconductor layer formed on the first insulating film and having first to fourth regions, forming a second insulating film on the semiconductor layer in the first region, removing the first insulating film and the semiconductor layer lying in the second region with the second insulating film used as a mask, forming a space portion in the first region by setting back a side surface of the semiconductor layer on the second region side with respect to a side surface of the first insulating film, forming a first element isolation insulating film in the space portion, forming an epitaxial layer on the substrate in the second region by use of an epitaxial growth process until the upper surface of the epitaxial layer is set substantially equal in height to the upper surface of the semiconductor layer, removing the second insulating film, and forming a first gate electrode on the semiconductor layer in the first region with a first gate insulating film disposed therebetween and forming a second gate electrode on the epitaxial layer in the second region with a second gate insulating film disposed therebetween.

DETAILED DESCRIPTION OF THE INVENTION

A semiconductor device according to embodiments of this invention uses a hybrid wafer having an SOI (Silicon On Insulator) region and a bulk region. There will now be described embodiments of this invention with reference to the accompanying drawings. In explaining the invention, the same reference symbols are attached to common portions throughout the drawings.

1. First Embodiment:

In the first embodiment, a space is formed in a boundary portion between the SOI region and the bulk region by setting back the side surface of the SOI layer with respect to the side surface of a buried insulating film in a lateral direction (horizontal direction with respect to the substrate). Then, a mask member used at the time of epitaxial growth is formed in the space and the mask member is left behind as it is and used as an element isolation region.

Next, first to fourth examples of the first embodiment are explained below.

[1-1] FIRST EXAMPLE

The first example of the first embodiment shows the basic structure of the first embodiment in which a space is formed between the SOI layer and the epitaxial layer and a mask member formed in the space and used at the time of epitaxial growth is used as an element isolation region.

Figure 1:
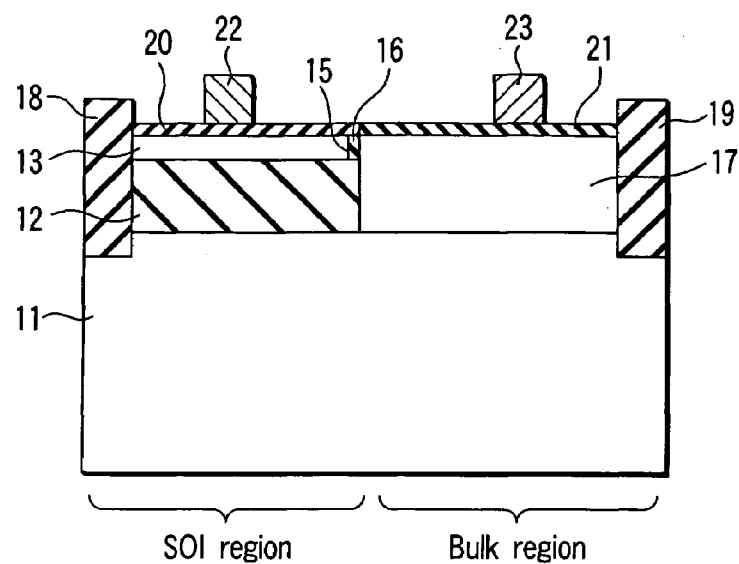
FIG. 1 is a cross sectional view showing a first example of a semiconductor device according to a first embodiment of this invention.

FIG. 1 is a cross sectional view showing a first example of a semiconductor device according to a first embodiment of this invention. As shown in FIG. 1, in the first example of the first embodiment, a buried insulating film 12 is formed on a supporting substrate 11 in the SOI region and an SOI layer 13 is formed on the buried insulating film 12. In the bulk region, an epitaxial layer 17 is formed on the supporting substrate 11 and the upper surface of the epitaxial layer 17 is set at substantially the same height as the upper surface of the SOI layer 13.

In this case, a space portion 15 is formed between the SOI layer 13 and the epitaxial layer 17 since the side surface of the SOI layer 13 which lies on the epitaxial layer 17 side is depressed or set back with respect to the side surface of the buried insulating film 12 which lies on the epitaxial layer 17 side. Further, an element isolation region 16a is formed on the buried insulating film 12 to fill the space portion 15. The upper surface of the element isolation region 16a is set at substantially the same height as the upper surfaces of the SOI layer 13 and epitaxial layer 17.

Thus, the SOI layer 13 of the SOI region and the epitaxial layer 17 of the bulk region are electrically isolated from each other by the presence of the element isolation region 16a. In other words, the epitaxial layer 17 is formed in contact with the buried insulating film 12 and element isolation region 16a and is not formed in contact with the SOI layer 13.

In this case, it is preferable to form the element isolation region 16a by use of the same material (for example, $SiO_2$ film) as that of the buried insulating film 12.

FIGS. 2 to 8 are cross sectional views showing the manufacturing steps of the first example of the semiconductor device according to the first embodiment of this invention. A manufacturing method of the first example according to the first embodiment is explained below.

Figure 2:
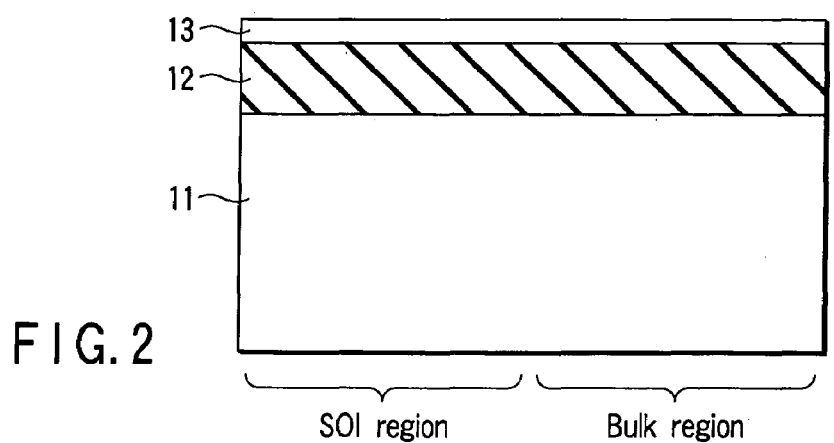
FIGS. 2 to 8 are cross sectional views showing the manufacturing steps of the first example of the semiconductor device according to the first embodiment of this invention.

First, as shown in FIG. 2, an SOI wafer having a supporting substrate 11, buried insulating film 12 and SOI layer 13 is prepared. At this time, a p-type silicon substrate having the resistivity of approximately 10 $\Omega \cdot cm$ is used as the supporting substrate 11, an $SiO_2$ film having the film thickness of approximately 150 nm is used as the buried insulating film 12 and a single crystal silicon film having the film thickness of approximately 50 nm is used as the SOI layer 13. However, this is not limitative.

Figure 3:
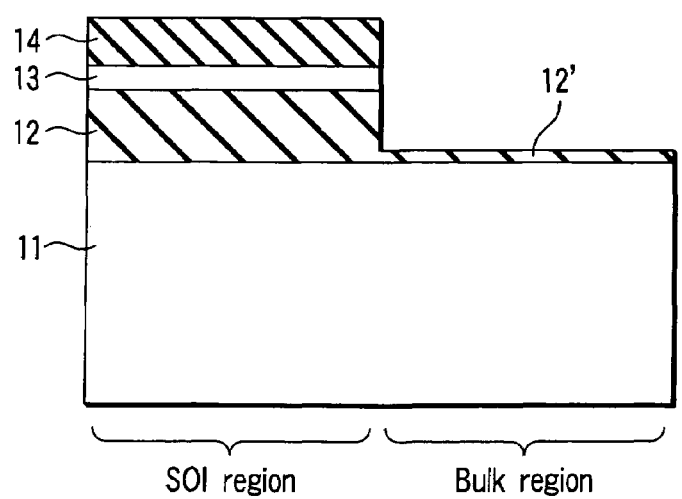

Next, as shown in FIG. 3, a first mask member 14 for protection is deposited on the SOI layer 13. For example, the first mask member 14 may be an SiN film or a material film (for example, $SiO_2$ film) formed of the same material as that of the buried insulating film 12 or a second mask member 16 which will be described later. Then, the first mask member 14, SOI layer 13 and buried insulating film 12 in the bulk region are sequentially etched and removed by a photolithography process or anisotropic dry-etching (for example, RIE (Reactive Ion Etching)) process. At this time, in order to prevent damage caused in the anisotropic dry-etching process from being given to the supporting substrate 11 in the bulk region, a thin buried insulating film 12' may be left behind on the supporting substrate 11.

Figure 4:
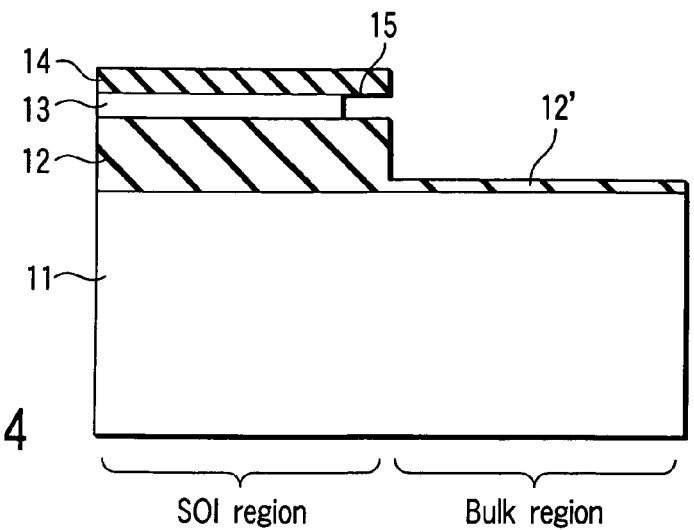

Next, as shown in FIG. 4, in order to set back the exposed side surface of the SOI layer 13, the SOI layer 13 is removed by an isotropic etching (for example, CDE (Chemical Dry Etching)) process. Thus, a space portion 15 is formed.

Figure 5:
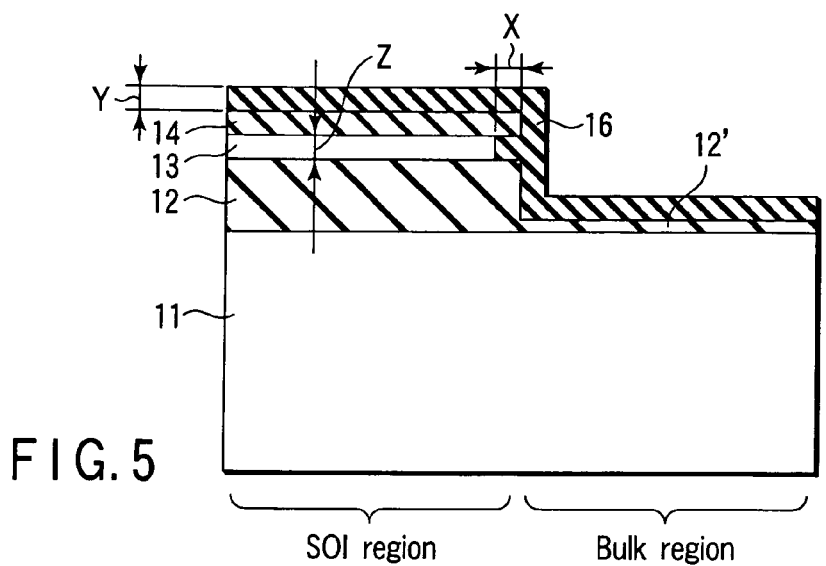

After this, as shown in FIG. 5, a second mask member (for example, $SiO_2$ film) 16 for protection of the side wall of the SOI layer 13 is deposited on the entire surface of the structure. In this case, the film thickness Y of the second mask member 16 is set equal to or larger than half of the film thickness Z of the SOI layer 13. As a result, the space portion 15 can be easily filled with the second mask member 16 irrespective of the width X of the space portion 15 corresponding to a distance by which the side surface of the SOI layer 13 is depressed or set back with respect to the side surface of the buried insulating film 12.

Figure 6:
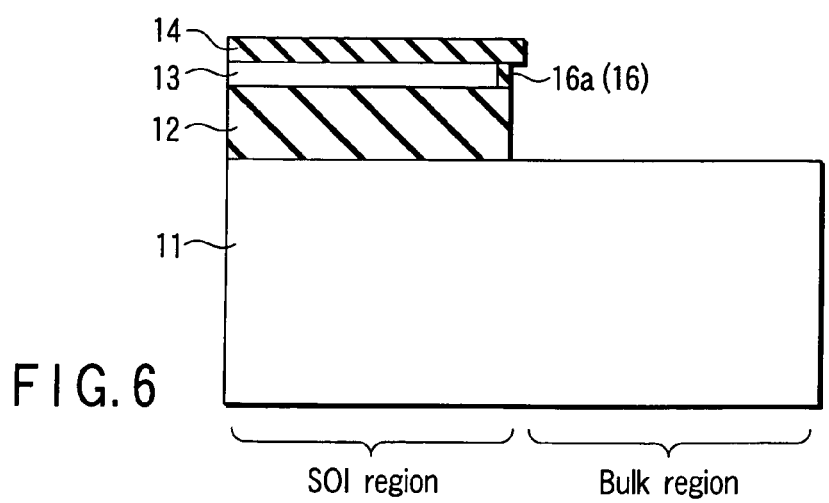

Next, as shown in FIG. 6, the second mask member 16 and buried insulating film 12' are etched and removed by an isotropic etching process. As the isotropic etching process, a wet etching process using an HF solution, $NH_4F$ solution or the like can be used. Thus, an element isolation region 16a formed of the second mask member 16 is formed in the space portion 15 and the upper surface of the supporting substrate 11 in the bulk region is exposed. At this time, it is preferable to set the setback distance X and the film thickness Y of the second mask member 16 by taking an etching amount in this step into consideration so as to leave behind the mask member 16 used as the element isolation region 16a in the space portion 15.

Figure 7:
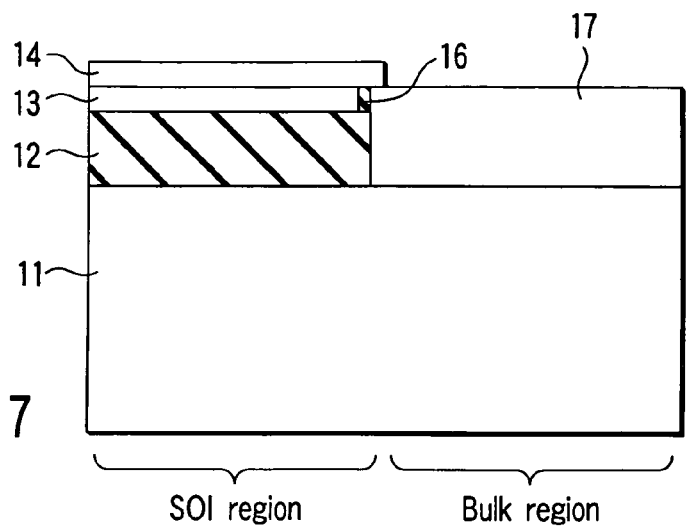

After this, as shown in FIG. 7, an epitaxial layer 17 is formed as an element forming film of single crystal silicon or the like on the exposed portion of the supporting substrate 11 by the epitaxial growth technique. In the epitaxial growth process, the heights of the upper surface of the epitaxial layer 17 and the upper surface of the SOI layer 13 are adjusted so as to be set substantially equal to each other.

In the epitaxial growth process, a method for growing an epitaxial layer 17 on the entire surface and then polishing the epitaxial layer 17 to the height of the mask member 14 by use of a CMP (Chemical Mechanical Polish) process to make the surface thereof flat can be used. However, in this case, a difference in height between the SOI layer 13 and the epitaxial layer 17 by an amount corresponding to the film thickness of the mask member 14 occurs and the flatness and crystallinity of the epitaxial layer 17 may be degraded due to dishing or scratching. Further, it is not preferable from the viewpoint of the cost.

Figure 8:
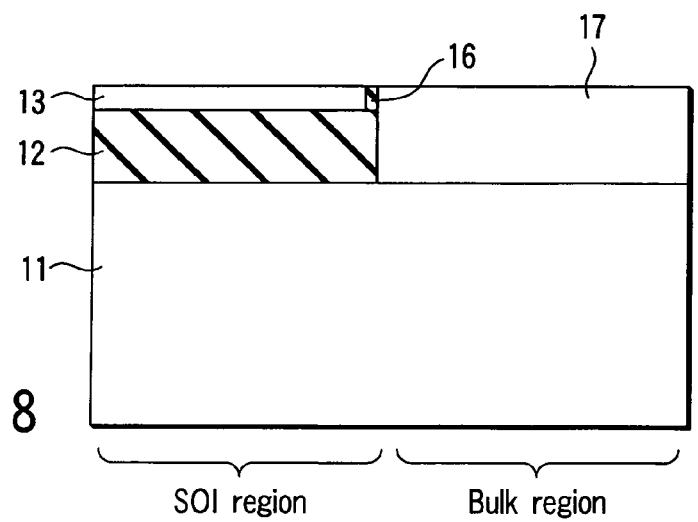

Next, as shown in FIG. 8, after the epitaxial growth process, the first mask member 14 is removed.

Then, as shown in FIG. 1, gate insulating films 20, 21, gate electrodes 22, 23 and element isolation regions 18, 19 of the STI (Shallow Trench Isolation) structure are formed.

According to the first example according to the first embodiment, the following effects can be attained.

(1) The space portion 15 is formed between the SOI layer 13 and the epitaxial layer 17 by setting back the side surface of the SOI layer 13 with respect to the side surface of the insulating film 12. As a result, the mask member 16 for the SOI layer 13 formed in the space portion 15 can be used as the element isolation region 16a. Therefore, unlike the conventional fourth method, it is not necessary to remove the mask member 116 and the concave portion 160 which occurs when the mask member 116 is removed is not formed. Thus, it is not necessary to form an element isolation region with a large space which is used to remove the concave portion 160 and, as a result, a space for the element isolation region 16a in the boundary portion between the SOI region and the bulk region can be made small. Further, the depth of the element isolation region 16a in the boundary portion can be decreased to depth corresponding to the film thickness of the SOI layer 13.

(2) In the conventional fourth method, a material of the electrode 131 is filled into the concave portion 160 after the concave portion 160 is formed and then the element isolation region 130 is formed to remove the concave portion 160. Therefore, if an electrode material is filled deep into the concave portion 160, the electrode material is left behind as a residue in the concave portion 160 in some cases after the element isolation region 130 is processed. As a result, the gate electrodes cross the same boundary portion between the SOI region and the bulk region by plural times and there occurs a possibility that a short-circuiting failure will occur.

On the other hand, according to the first example of the first embodiment, the concave portion 160 is not formed as described above and the problem of occurrence of the short-circuiting failure can be solved.

Figure 44:
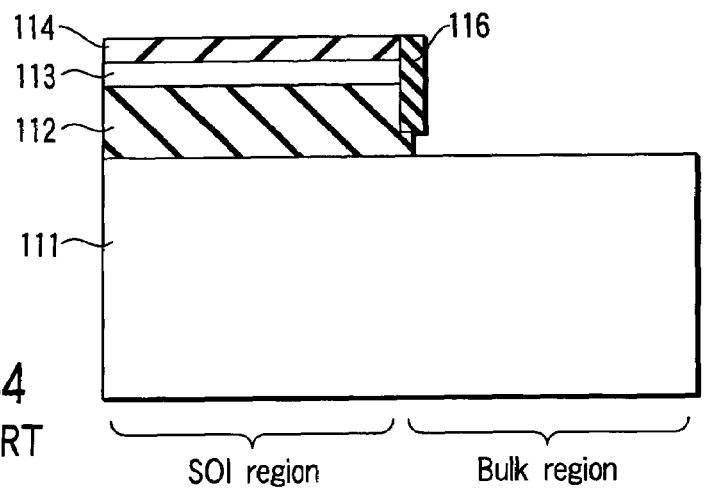
Figure 45:
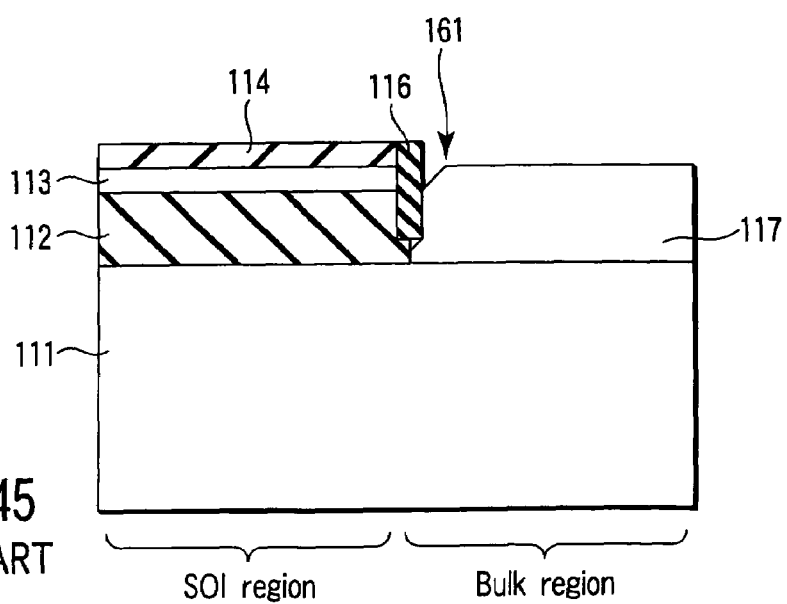
Figure 46:
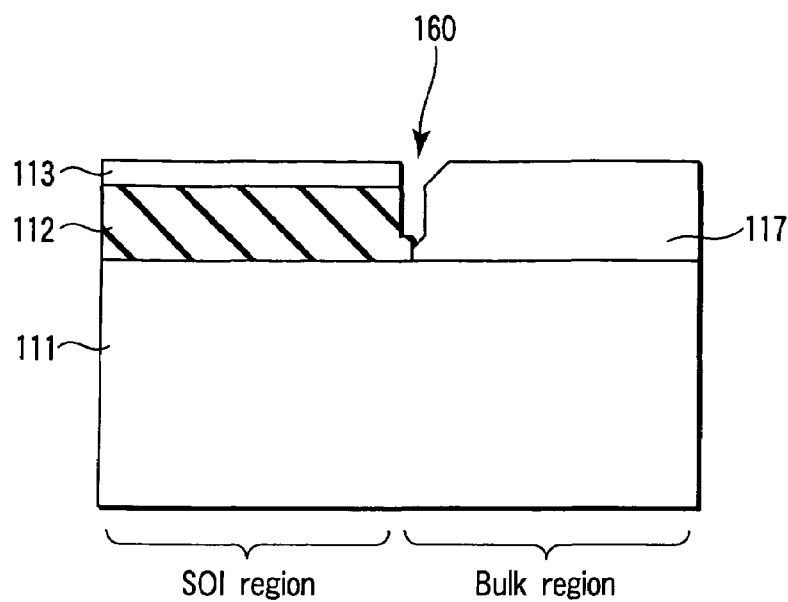
Figure 47:
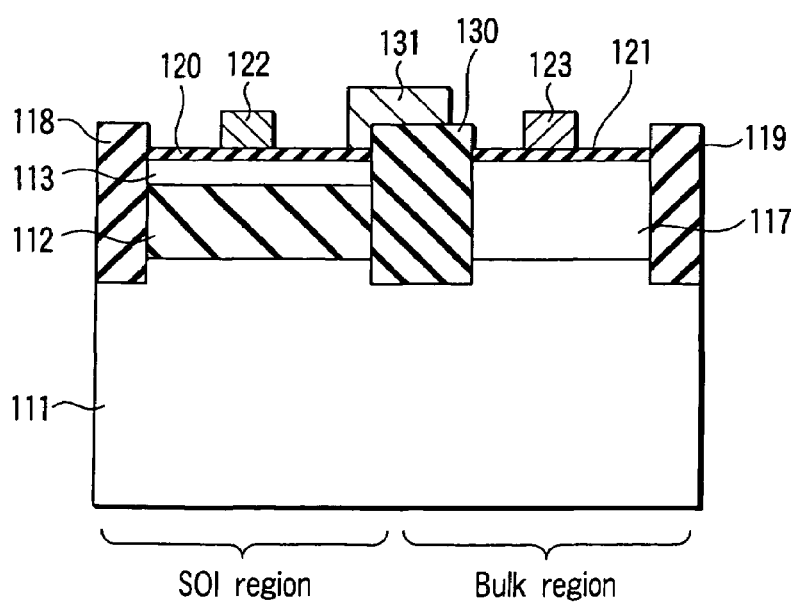

(3) In the conventional fourth method, the second mask member 116 formed of a material different from that of the buried insulating film 112 is formed on the side surface of the SOI layer 113 so that the side surface of the SOI layer 113 can be prevented from being etched in the step (the step of FIG. 44) of removing the buried insulating film 112". Therefore, if the etching condition for removing only the buried insulating film 112 is set, the second mask member 116 is not etched. As a result, only the buried insulating film 112 is etched to a large extent and the side surface of the buried insulating film 112 is set back with respect to the side surface of the second mask member 116 to form an overhang in some cases. If the epitaxial layer 117 is formed while the overhang is formed, a cavity or crystal defect will occur in the overhang portion.

On the other hand, according to the first example of the first embodiment, the element isolation region 16a can be formed of the same material (for example, $SiO_2$ film) as that of the buried insulating film 12. Therefore, in the step (the step of FIG. 6) of removing the buried insulating film 12', the buried insulating film 12 and mask member 16 can be removed at the same time while the side surface of the SOI layer 13 is prevented from being etched. Thus, a problem of the overhang as in the conventional case will not occur. As a result, there is no possibility that a cavity or crystal defect will occur due to the overhang in the epitaxial layer 17.

[1-2] SECOND EXAMPLE

In the second example of the first embodiment, a portion for electrically isolating the SOI layer and epitaxial layer and a portion for electrically connecting the SOI layer and epitaxial layer are separately provided in regions between the SOI regions and the bulk regions.

Figure 9:
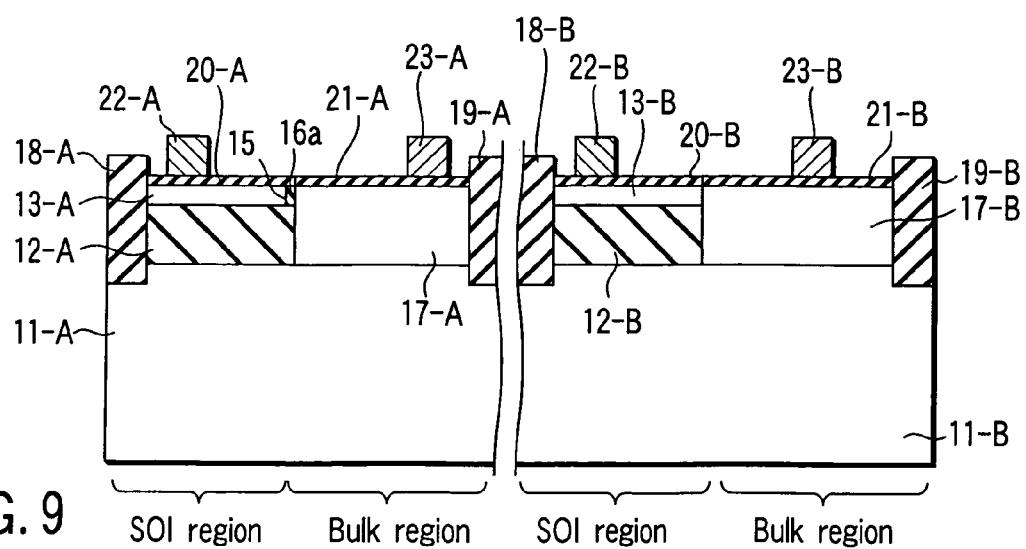
FIG. 9 is a cross sectional view showing a second example of the semiconductor device according to the first embodiment of this invention.

FIG. 9 is a cross sectional view showing a semiconductor device in a portion for electrically isolating the SOI layer and epitaxial layer and a portion for electrically connecting the SOI layer and epitaxial layer in the second example of the first embodiment.

In FIG. 9, a region (which is hereinafter referred to as an insulating region) on the left side of the drawing indicates a portion in which an SOI layer 13-A and epitaxial layer 17-A are electrically isolated. The insulating region has substantially the same structure as that of the first example of the first embodiment and therefore the explanation thereof is omitted.

On the other hand, in FIG. 9, a region (which is hereinafter referred to as a conducting region) on the right side of the drawing indicates a portion in which an SOI layer 13-B and epitaxial layer 17-B are electrically connected to each other. That is, the SOI layer 13-B and epitaxial layer 17-B are formed in direct contact with each other. The other structure is the same as that of the insulating region.

FIGS. 10 to 15 are cross sectional views showing the manufacturing steps of the second example of the semiconductor device according to the first embodiment of this invention. The manufacturing method of the second example according to the first embodiment is explained below. In this case, the explanation for the insulating region having the same structure as that of the first example is simplified.

Figure 10:
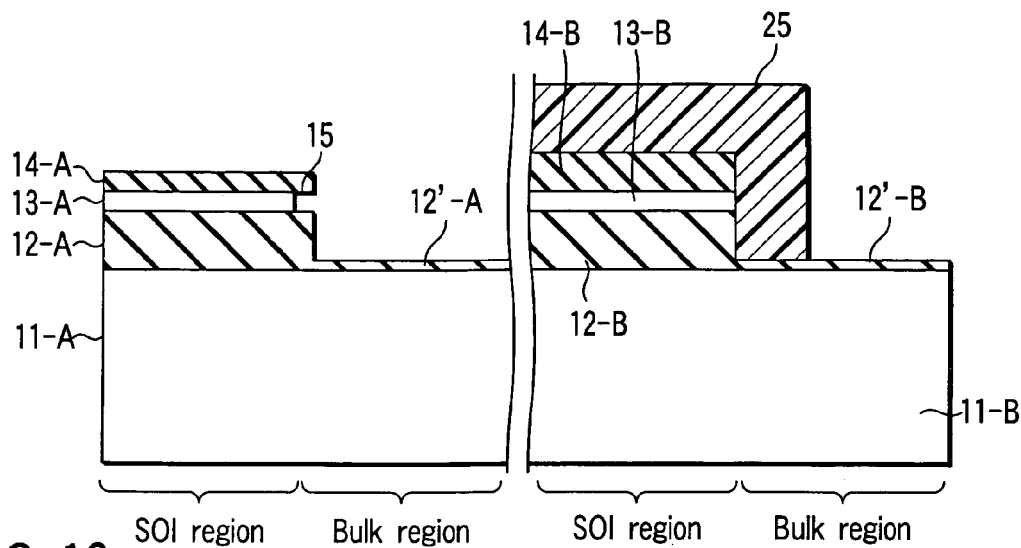
FIGS. 10 to 15 are cross sectional views showing the manufacturing steps of the second example of the semiconductor device according to the first embodiment of this invention.

First, as shown in FIG. 10, a resist 25 is formed to cover the side surface of the SOI layer 13-B in the conducting region after a thin buried insulating film 12-B' is left behind like the first example. Next, in the insulating region, a space portion 15 is formed. At this time, in the conducting region, no space portion 15 is formed since the side surface of the SOI layer 13-B is covered with the resist 25.

Figure 11:
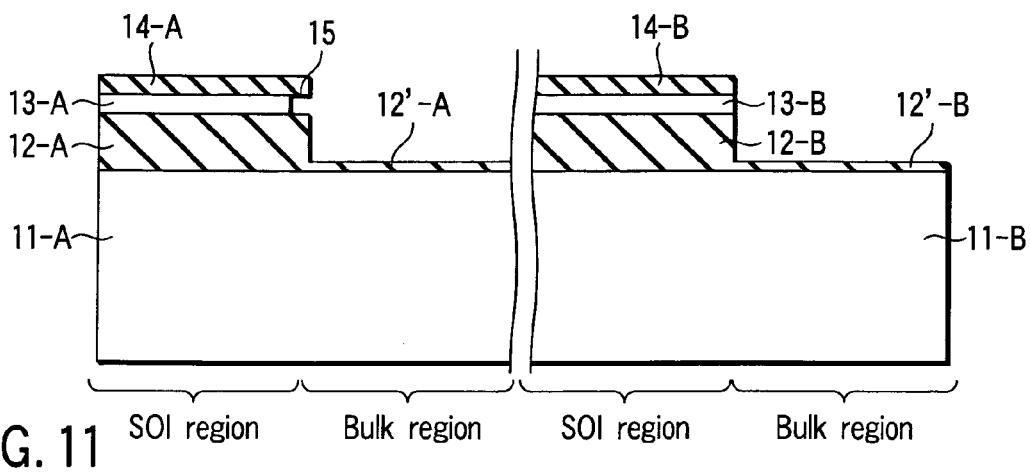

Next, as shown in FIG. 11, the resist 25 in the conducting region is removed.

Figure 12:
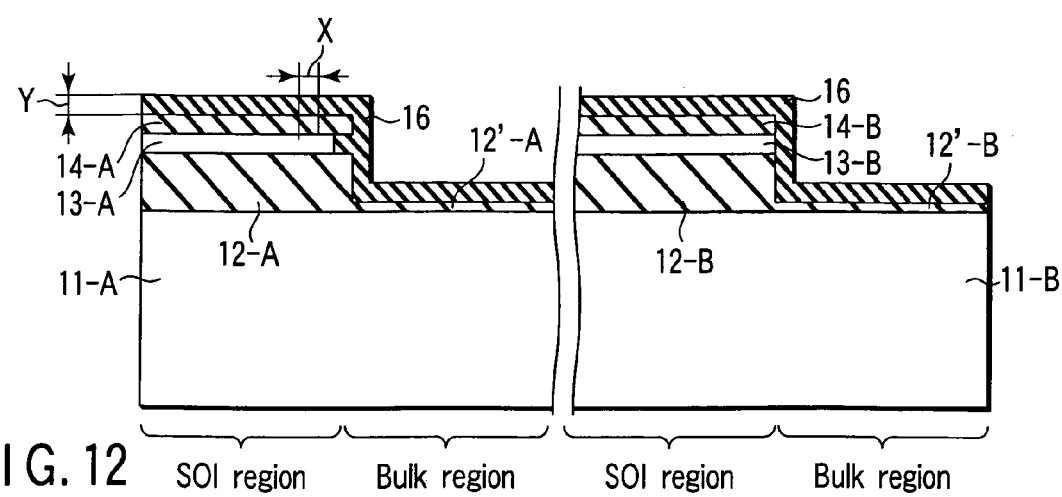

After this, as shown in FIG. 12, a second mask member (for example, $SiO_2$ film) 16 is deposited on the entire surface. In the insulating region, the second mask member 16 is formed in the space portion 15.

Figure 13:
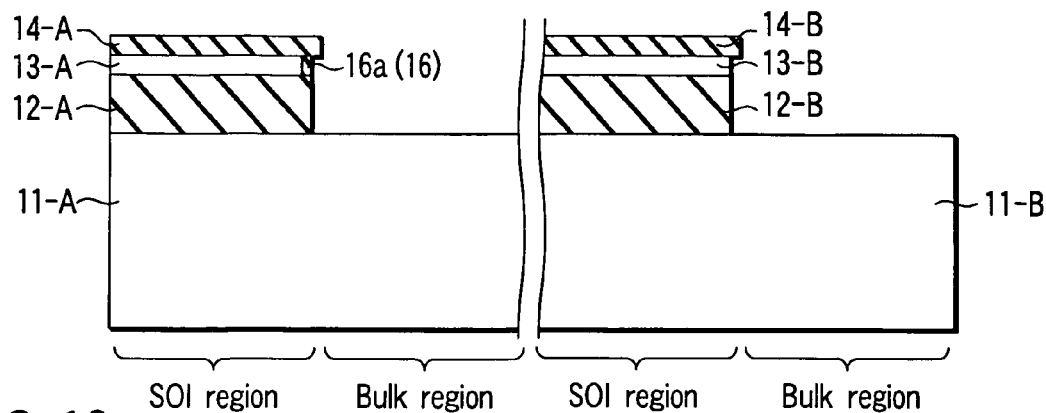

Then, as shown in FIG. 13, the second mask member 16 and buried insulating films 12'-A, 12'-B are etched and removed by use of a wet etching process using an HF solution, $NH_4F$ solution or the like. As a result, the upper surfaces of supporting substrates 11-A, 11-B in the bulk region are exposed. In the insulating region, an element isolation region 16a formed of the second mask member 16 is formed in the space portion 15.

Figure 14:
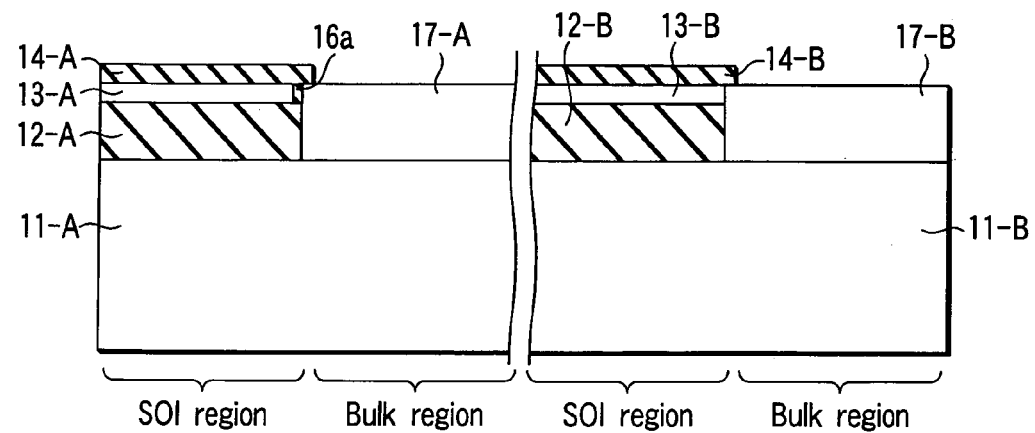

Next, as shown in FIG. 14, epitaxial layers 17-A, 17-B are formed as element isolation films of single crystal silicon or the like on the exposed portions of the supporting substrates 11-A, 11-B by the epitaxial growth technique. In the epitaxial growth process, the heights of the upper surfaces of the epitaxial layers 17-A, 17-B and the upper surfaces of the SOI layers 13-A, 13-B are adjusted so as to be set substantially equal to each other. In this case, the SOI layer 13-B and epitaxial layer 17-B are formed in direct contact with each other in the conducting region. However, in the insulating region, since the element isolation region 16a is formed, the SOI layer 13-A and epitaxial layer 17-A are not formed in direct contact with each other.

Figure 15:
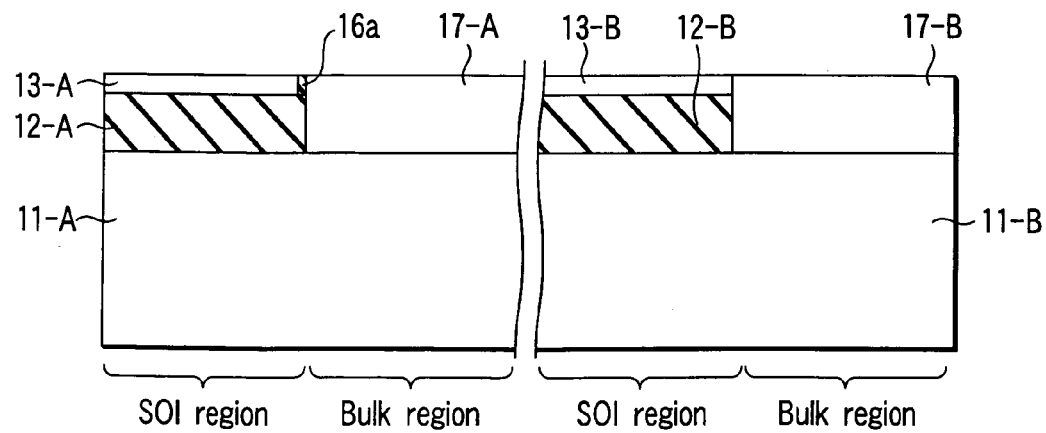

After this, as shown in FIG. 15, the first mask members 14-A, 14-B are removed.

Then, as shown in FIG. 9, gate insulating films 20-A, 20-B, 21-A, 21-B, gate electrodes 22-A, 22-B, 23-A, 23-B and element isolation regions 18-A, 18-B, 19-A, 19-B of the STI structure are formed.

According to the second example of the first embodiment, the same effect as that of the first example of the first embodiment can be attained in the insulating region. Further, in the conducting region, since the SOI layer 13-B and epitaxial layer 17-B are formed in direct contact with each other, the structure is effective when it is desired to electrically connect the two layers.

[1-3] THIRD EXAMPLE

In the third example according to the first embodiment, when a facet is formed in the epitaxial growth process, an element isolation region is newly formed to remove the facet instead of using the mask member in the first example as the element isolation region as it is.

Figure 16:
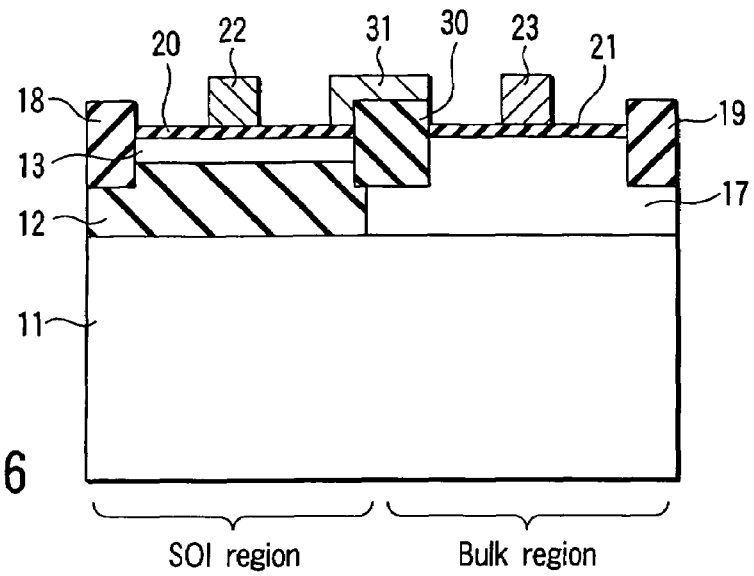
FIG. 16 is a cross sectional view showing a third example of the semiconductor device according to the first embodiment of this invention.

FIG. 16 is a cross sectional view showing a third example of a semiconductor device according to the first embodiment of this invention. As shown in FIG. 16, the third example of the first embodiment is different from the first example in that an element isolation region 30 which is not a mask member is newly formed to remove the facet of the epitaxial layer 17. The element isolation region 30 is formed to extend from an internal portion of the SOI layer 13 into the epitaxial layer 17. Further, the element isolation region 30 may be formed to penetrate the buried insulating film 12 and reach an internal portion of the substrate 11. However, it is only required to electrically isolate the SOI layer 13 and epitaxial layer 17 from each other and it is not always necessary to form the element isolation region 30 which reaches the internal portion of the substrate 11.

Figure 17:
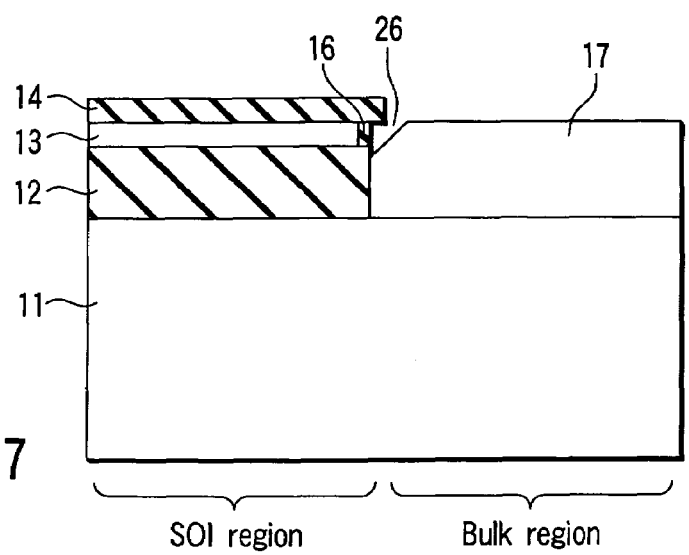
FIGS. 17, 18 are cross sectional views showing the manufacturing steps of the third example of the semiconductor device according to the first embodiment of this invention.
Figure 18:
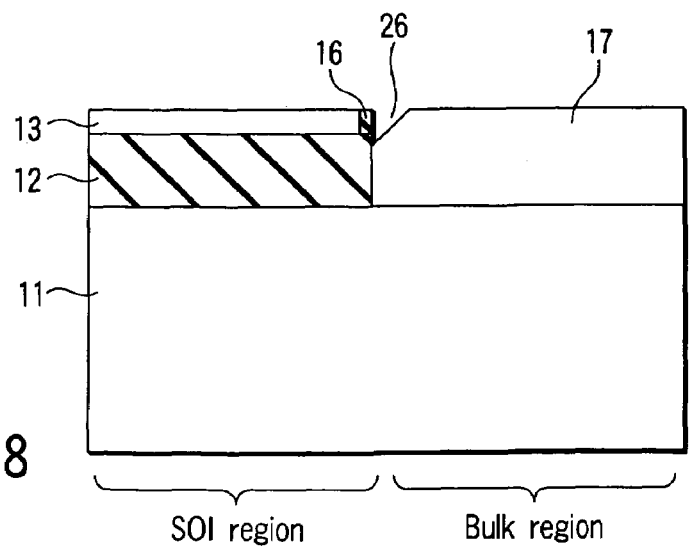

FIGS. 17, 18 are cross sectional views showing the manufacturing steps of the third example of the semiconductor device according to the first embodiment of this invention. The manufacturing method of the third example according to the first embodiment is explained below. In this case, only a portion which is different from that of the structure of the first example is explained.

First, as shown in FIG. 17, an epitaxial layer 17 is formed as an element forming film of single crystal silicon or the like on an exposed portion of a supporting substrate 11 by the epitaxial growth technique. In the epitaxial growth process, the heights of the upper surface of the epitaxial layer 17 and the upper surface of the SOI layer 13 are adjusted so as to be set substantially equal to each other. However, a facet 26 may be formed on the upper end portion of the epitaxial layer 17 on the SOI region side in some cases.

Next, as shown in FIG. 18, a first mask member 14 is removed.

Then, as shown in FIG. 16, an element isolation region 30 of the STI structure is formed to remove the facet after gate insulating films 20, 21 are formed. At the same time, element isolation regions 18, 19 in the SOI region and bulk region are formed. After this, gate electrodes 22, 23, 31 are formed.

According to the third example of the first embodiment, since the element isolation region 30 is formed in a boundary portion between the SOI region and the bulk region, the method is effective when a facet is formed after the epitaxial growth process is performed in the first example.

Further, the element isolation region 30 of the third example occupies a larger space than the element isolation region 16a of the first example. However, since the element isolation region is not formed to remove the deep concave portion 160 unlike the conventional case, it is of course possible to sufficiently reduce the space of the element isolation region in comparison with the conventional case.

[1-4] FOURTH EXAMPLE

In the first example of the first embodiment, the element isolation region in the boundary portion between the SOI region and the bulk region is formed only between the SOI layer and the epitaxial layer. However, in the fourth example of the first embodiment, the element isolation region is formed not only between the SOI layer and the epitaxial layer but also between the buried insulating film and the epitaxial layer.

Figure 19:
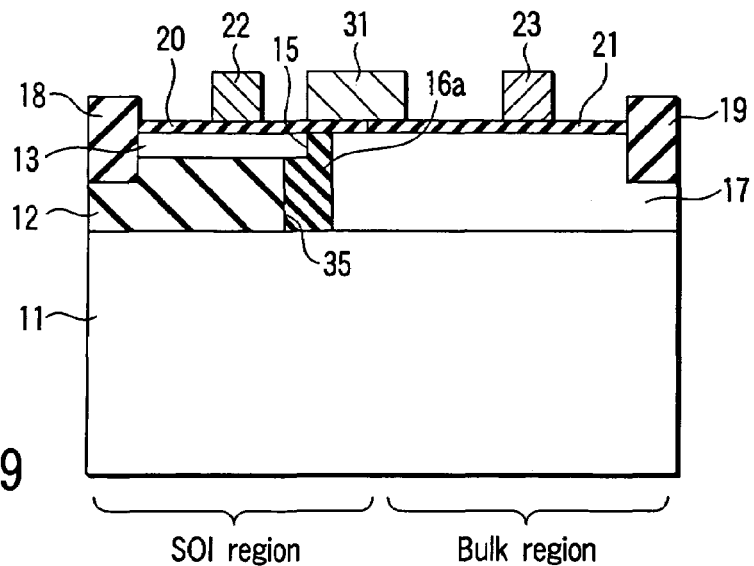
FIG. 19 is a cross sectional view showing a fourth example of the semiconductor device according to the first embodiment of this invention.

FIG. 19 is a cross sectional view showing a fourth example of a semiconductor device according to the first embodiment of this invention. As shown in FIG. 19, the fourth example of the first embodiment is different from the first example in the position of formation of the element isolation region 16a. That is, the element isolation region 16a is formed not only between the SOI layer 13 and the epitaxial layer 17 but also between the buried insulating film 12 and the epitaxial layer 17.

In this case, the side surface of the buried insulating film 12 on the epitaxial layer 17 side is depressed or set back with respect to the side surface of the SOI layer 13 on the epitaxial layer 17 side. Therefore, the width of a space portion 35 between the buried insulating film 12 and the epitaxial layer 17 is larger than the width of a space portion 15 between the SOI layer 13 and the epitaxial layer 17. In other words, the side surface of the SOI layer 13 on the epitaxial layer 17 side projects from the side surface of the buried insulating film 12 on the epitaxial layer 17 side.

As in the fourth example, when the contact surface area between the element isolation region 16a and the epitaxial layer 17 is large, it is preferable to form the element isolation region 16a by use of an SiN film so as to suppress formation of a facet at the time of epitaxial growth.

FIGS. 20 to 25 are cross sectional views showing the manufacturing steps of the fourth example of the semiconductor device according to the first embodiment of this invention. The manufacturing method of the fourth example according to the first embodiment is explained below. In this case, only a portion having a structure different from that of the first example is explained.

Figure 20:
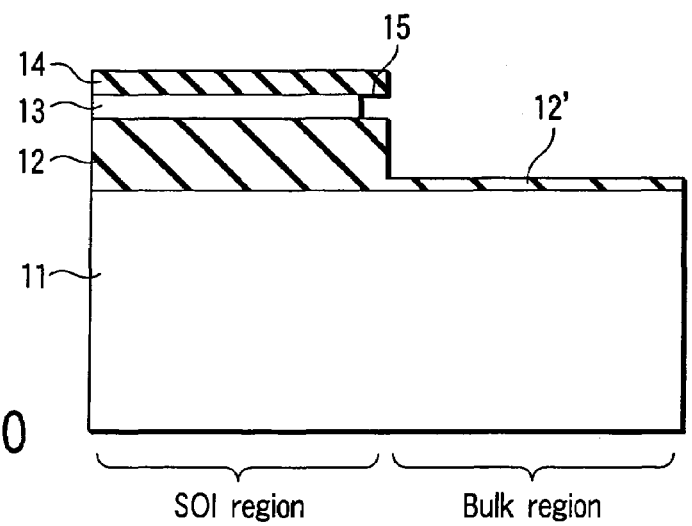
FIGS. 20 to 25 are cross sectional views showing the manufacturing steps of the fourth example of the semiconductor device according to the first embodiment of this invention.

First, as shown in FIG. 20, a first mask member 14 for protection is deposited on an SOI wafer having a supporting substrate 11, buried insulating film 12 and SOI layer 13. For example, the first mask member 14 may be formed of an SiN film, $SiO_2$ film or the like, but it is preferably formed of a film of a material different from that of the buried insulating film 12. Next, the first mask member 14, SOI layer 13 and buried insulating film 12 in the bulk region are sequentially etched and removed by an anisotropic etching (for example, RIE) process. At this time, in order to prevent damage caused in the anisotropic etching process from being given to the supporting substrate 11 in the bulk region, a thin buried insulating film 12' may be left behind on the supporting substrate 11. Then, the side surface of the SOI layer 13 is set back with respect to the side surface of the buried insulating film 12 to form a space portion 15.

Figure 21:
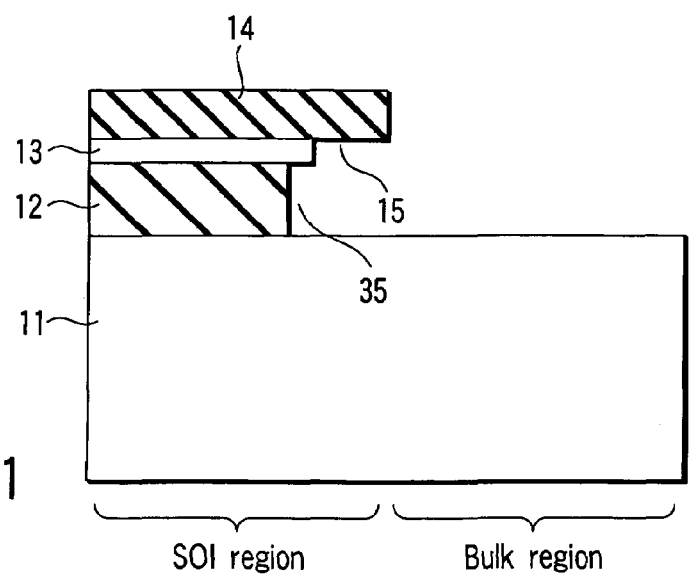

After this, as shown in FIG. 21, the buried insulating film 12 is etched by the isotropic etching process to set back the side surface of the buried insulating film 12 with respect to the side surface of the first mask member 14 so as to form a space portion 35.

Figure 22:
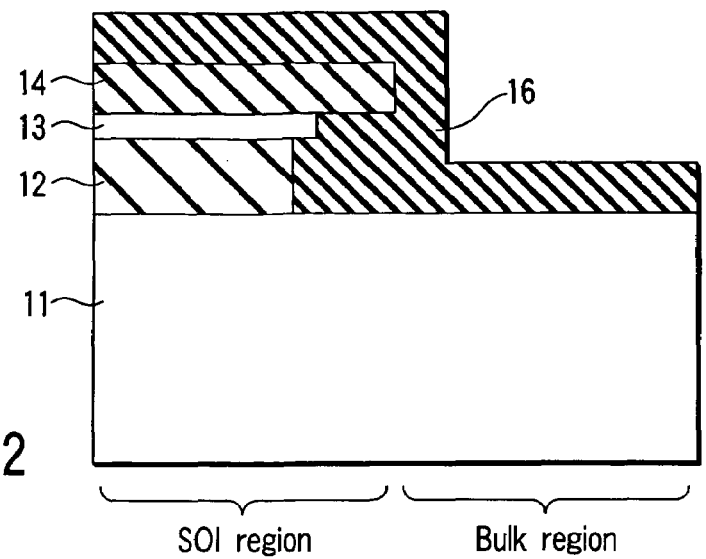

Then, as shown in FIG. 22, a second mask member (for example, SiN film) 16 for protection of the side wall of the SOI layer 13 is deposited on the entire surface of the structure.

Figure 23:
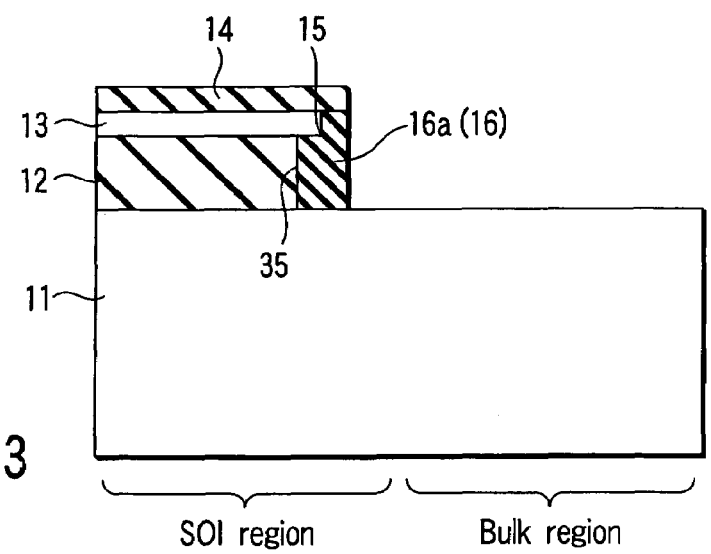

After this, as shown in FIG. 23, the second mask member 16 and buried insulating film 12' are etched and removed by an isotropic etching process. Thus, an element isolation region 16a formed of the second mask member 16 is formed in the space portions 15, 35 and the upper surface of the supporting substrate 11 in the bulk region is exposed.

Figure 24:
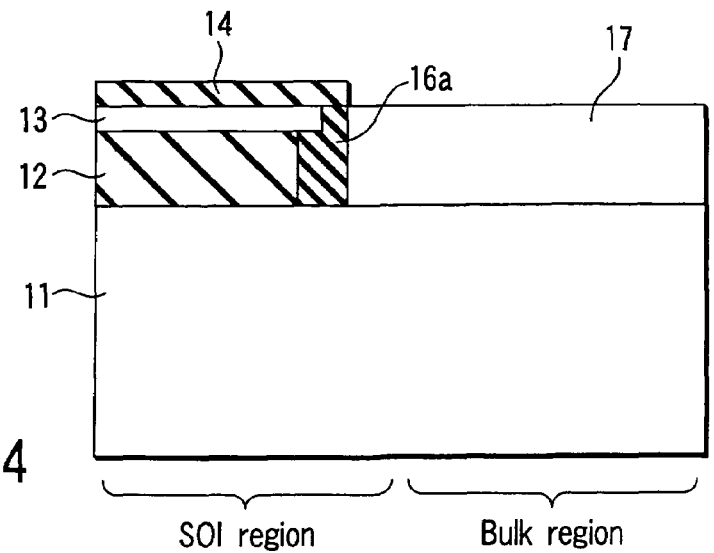

After this, as shown in FIG. 24, an epitaxial layer 17 is formed as an element forming film of single crystal silicon or the like on the exposed portion of the supporting substrate 11 by the epitaxial growth technique. In the epitaxial growth process, the heights of the upper surface of the epitaxial layer 17 and the upper surface of the SOI layer 13 are adjusted so as to be set substantially equal to each other.

Figure 25:
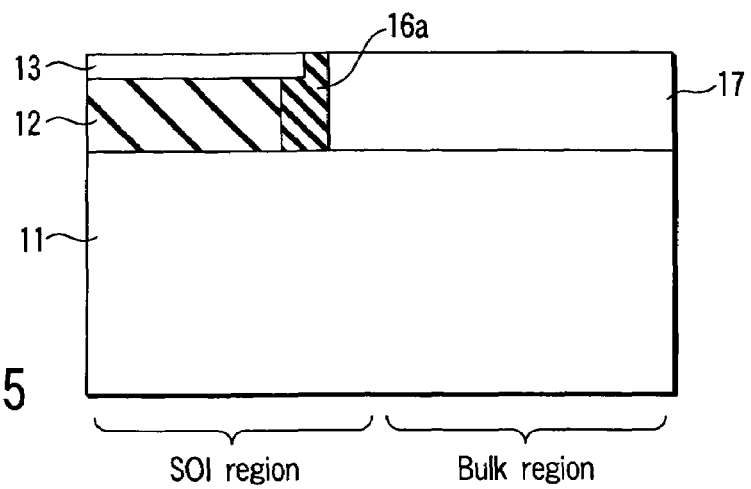

Next, as shown in FIG. 25, the first mask member 14 is removed after the epitaxial growth process.

Then, as shown in FIG. 19, gate insulating films 20, 21, gate electrodes 22, 23, 31 and element isolation regions 18, 19 of the STI structure are formed.

According to the fourth example of the first embodiment, like the first example, the mask member 16 for the SOI layer 13 formed at the time of epitaxial growth can be used as it is. Therefore, a space of the element isolation region can be reduced.

The element isolation region 16a of the fourth example occupies a larger space than the element isolation region 16a of the first example. However, unlike the conventional case, the element isolation region is not formed to remove the deep concave portion 160, and therefore, it is of course possible to sufficiently reduce the space (particularly, the lateral width of the element isolation region) of the element isolation region in comparison with the conventional case.

Further, the element isolation region 16a is formed of an SiN film which is different from a material of the buried insulating film 12. It is known that, in the selective epitaxial growth process, a facet can be made smaller (or formation of a facet can be prevented) on the epitaxial layer 17 when a boundary surface is formed between the epitaxial process 17 and the SiN film than when a boundary surface is formed between the epitaxial process 17 and the SiO$_2$ film. Therefore, formation of the facet on the boundary between the element isolation region 16a and the epitaxial process 17 can be suppressed by forming the element isolation region 16a by use of the SiN film.

Figure 26:
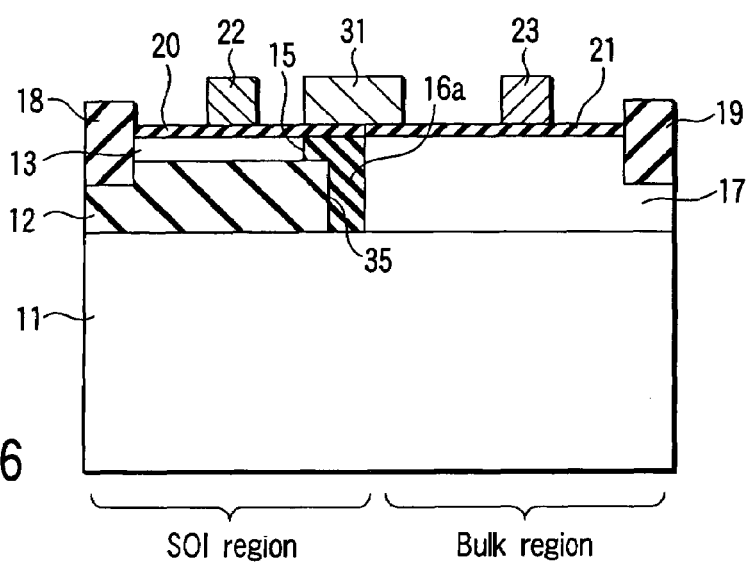
FIG. 26 is a cross sectional view showing another semiconductor device of the fourth example according to the first embodiment of this invention.

In this example, a case wherein the side surface of the buried insulating film 12 is set back with respect to the side surface of the SOI layer 13 is shown. However, in this case, it is important to form the space portions 15, 35 by setting back the side surfaces of both of the insulating film and SOI layer with respect to the side surface of the first mask member 14 and the structure is not limited to the structure shown in FIG. 19. For example, as shown in FIG. 26, the side surface of the SOI layer 13 can be set back with respect to the side surface of the buried insulating film 12. Therefore, the width of the space portion 15 can be made smaller than that of the space portion 35 (FIG. 19) or the width of the space portion 35 can be made smaller than that of the space portion 15 (FIG. 26).

2. Second Embodiment:

The second embodiment is an example in which the epitaxial growth process is not performed and an attempt is made to reduce a apace of an element isolation region in a boundary portion between an SOI region and a bulk region.

First and second examples of the second embodiment are explained below.

[2-1] FIRST EXAMPLE

The first example of the second embodiment is to form gate electrodes of a two-layered structure in the SOI region and bulk region and set the heights of the upper surfaces of both of the gate electrodes substantially equal to each other although the heights of the undersurfaces of both of the gate electrodes are different.

Figure 27:
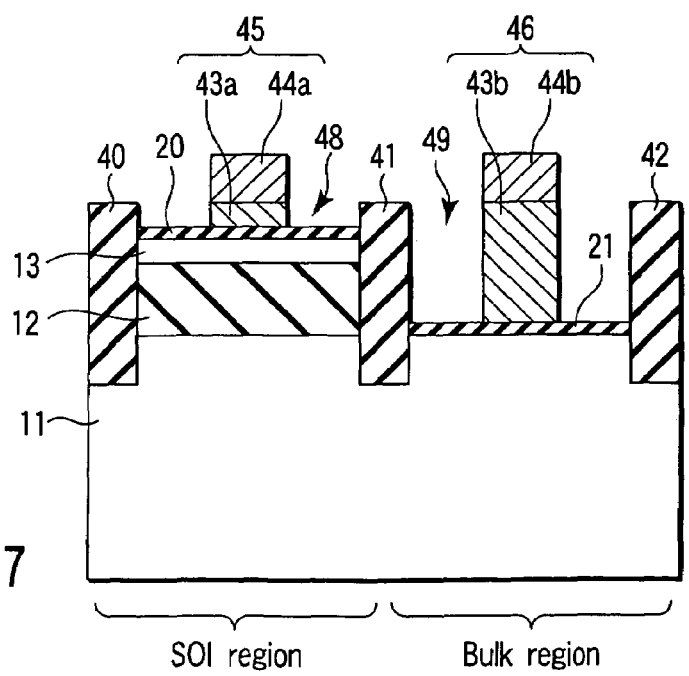
FIG. 27 is a cross sectional view showing a first example of a semiconductor device according to a second embodiment of this invention.

FIG. 27 is a cross sectional view showing the first example of a semiconductor device according to the second embodiment of this invention. As shown in FIG. 27, in the SOI region, a gate insulating film 20 is formed on an SOI layer 13 and a gate electrode 45 is formed on the gate insulating film 20. The gate electrode 45 has a two-layered structure having a lower electrode layer 43a and an upper electrode layer 44a.

In the bulk region, a gate insulating film 21 is formed on a supporting substrate 11 and a gate electrode 46 is formed on the gate insulating film 21. The gate electrode 46 has a two-layered structure having a lower electrode layer 43b and an upper electrode layer 44b.

The gate electrode 45 in the SOI region and the gate electrode 46 in the bulk region are different in the height of the substrate portions under the gate electrodes, but are substantially equal in the height of the upper surfaces of the gate electrodes. That is, the electrode layer 43b of the gate electrode 46 of the bulk region is made thicker than the electrode layer 43a of the gate electrode 45 of the SOI region so as to eliminate a difference in the height of the substrate portions under the gate electrodes of the SOI region and bulk region.

Further, an element isolation region 41 of the STI structure is formed in a boundary portion between the SOI region and the bulk region. Thus, the SOI layer 13 is electrically isolated from the substrate 11 of the bulk region. Further, element isolation regions 40, 42 are respectively formed in the SOI region and bulk region. It is preferable to form the element isolation region 41 by use of a material different from that of the buried insulating film 12.

FIGS. 28 to 32 are cross sectional views showing the manufacturing steps of the first example of the semiconductor device according to the second embodiment of this invention. The manufacturing method of the first example of the second embodiment is explained below.

Figure 28:
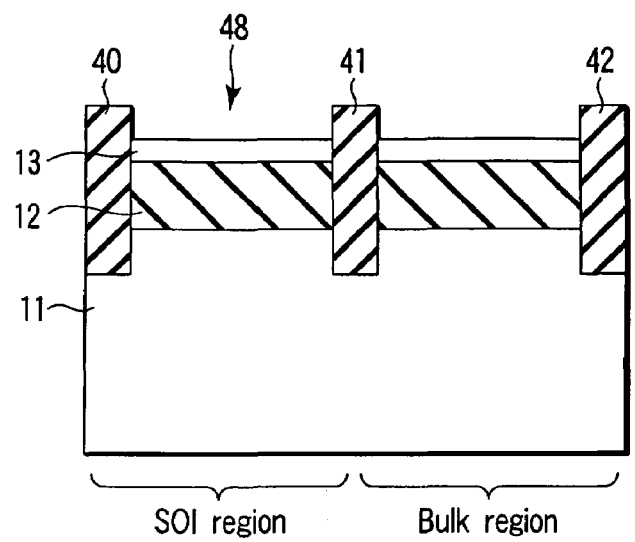
FIGS. 28 to 32 are cross sectional views showing the manufacturing steps of the first example of the semiconductor device according to the second embodiment of this invention.

First, as shown in FIG. 28, an SOI wafer having a supporting substrate 11, buried insulating film 12 and SOI layer 13 is prepared. Next, element isolation regions 40, 41, 42 are formed to extend from the surface of the SOI layer 13 into the supporting substrate 11. In this case, the upper portions of the element isolation regions 40, 41, 42 are formed to project from the upper surface of the SOI layer 13 so as to form concave portions 48.

Figure 29:
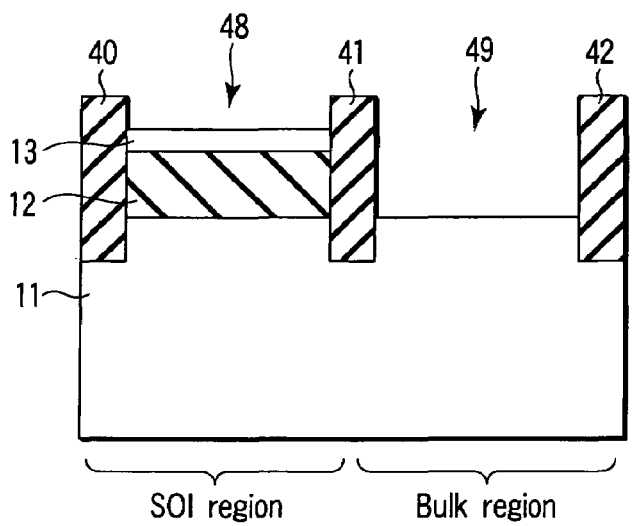

Next, as shown in FIG. 29, the SOI layer 13 and buried insulating film 12 in the bulk region are removed. As a result, in the SOI region, the concave portion 48 is kept unchanged and a concave portion 49 which is deeper than the concave portion 48 is formed in the bulk region.

When the buried insulating film 12 is removed, it is preferable to use a wet etching process at least in the final step so as not to give damage to the underground supporting substrate 11.

Further, at this time, in order not to give damage to the element isolation regions 41, 42 of the bulk region, it is preferable to lay an SiN liner (thin SiN film) or fill a material different from that of the buried insulating film 12 in the groove for the element isolation region.

Figure 30:
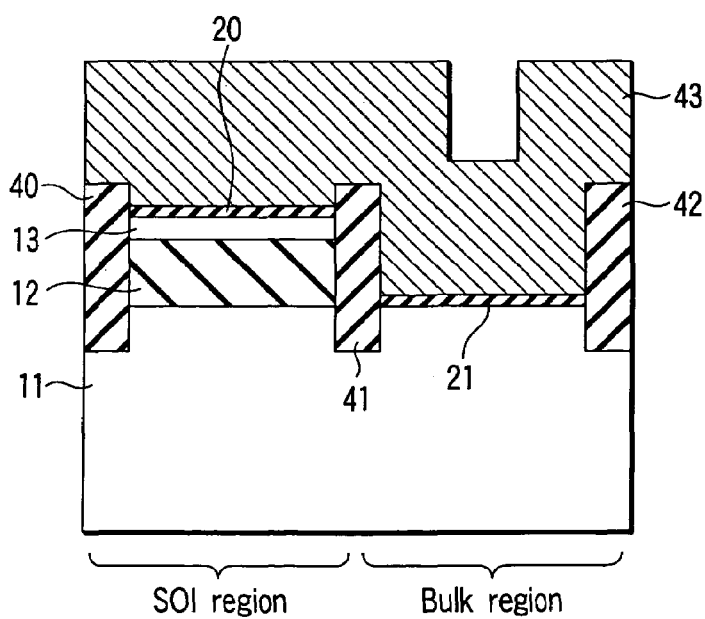

Next, as shown in FIG. 30, a gate insulating film 20 is formed on the SOI layer 13 and a gate insulating film 20 is formed on the supporting substrate 11. Then, a first electrode member 43 is formed on the gate insulating films 20, 21 and element isolation regions 40, 41, 42.

Figure 31:
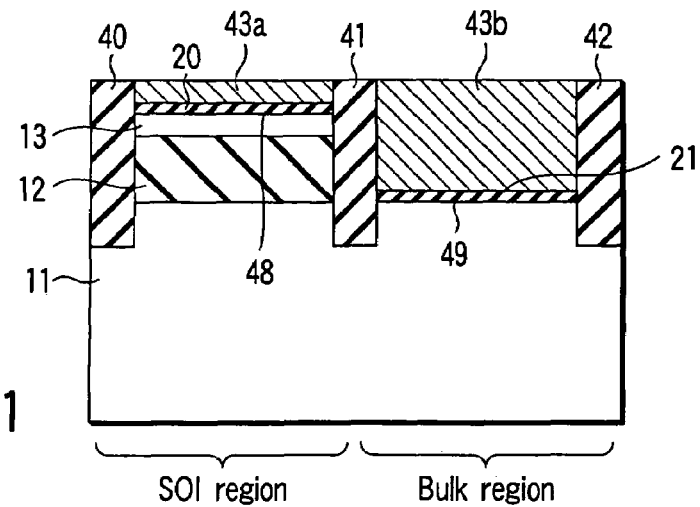

After this, as shown in FIG. 31, the upper surface of the first electrode member 43 is polished and made flat by the CMP process until the upper surfaces of the element isolation regions 40, 41, 42 are exposed. Therefore, the lower electrode layer 43a of the gate electrode in the SOI region is formed in the concave portion 48 and the lower electrode layer 43b of the gate electrode in the bulk region is formed in the concave portion 49. As a result, the upper surface of the lower electrode layer 43a in the SOI region and the upper surface of the lower electrode layer 43b in the bulk region can be set equal in height to each other and a difference in level between the SOI region and the bulk region can be eliminated.

Figure 32:
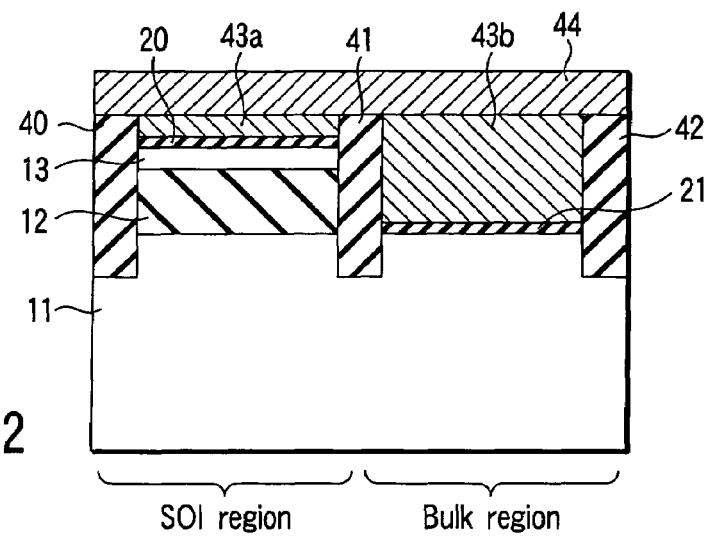

Next, as shown in FIG. 32, a second electrode member 44 is formed on the lower electrode layers 43a, 43b and element isolation regions 40, 41, 42.

After this, as shown in FIG. 27, the lower electrode layers 43a, 43b and second electrode member 44 are simultaneously processed. As a result, a gate electrode 45 formed of the lower electrode layer 43a and upper electrode layer 44a is formed in the SOI region and a gate electrode 46 formed of the lower electrode layer 43b and upper electrode layer 44b is formed in the bulk region.

According to the first example of the second embodiment, the following effects can be attained.

(1) In the first example of the second embodiment, since the selective epitaxial growth process is not performed in the bulk region, it is not necessary to form a mask member used at the time of epitaxial growth on the side surface of the SOI layer 13. Therefore, since the concave portion 160 caused by removing the mask member is not formed, it is not necessary to form a large element isolation region which is used to remove the concave portion 160. As a result, a space of the element isolation region 41 in the boundary portion between the SOI region and the bulk region can be reduced.

(2) In the prior art, there may occur a possibility that a difference in level between the SOI layer 13 and the epitaxial layer 17 occurs due to a variation in the film thickness of the selective growing films formed at the time of epitaxial growth. If a gate electrode is formed with the difference in level kept un-eliminated, it becomes impossible to form gate electrodes of the same height in the SOI region and bulk region.

On the other hand, in the first example of the second embodiment, since the selective epitaxial growth process is not performed in the bulk region, a difference in level occurs between the SOI region and the bulk region. However, the difference in level can be eliminated by use of the lower electrode layers 43a, 43b of the gate electrodes. Therefore, the gate electrodes 45, 46 of the same height can be formed in the SOI region and bulk region.

[2-2] SECOND EXAMPLE

The second example of the second embodiment is a modification of the first example and is an example in which an EEPROM is formed in the bulk region.

Figure 33:
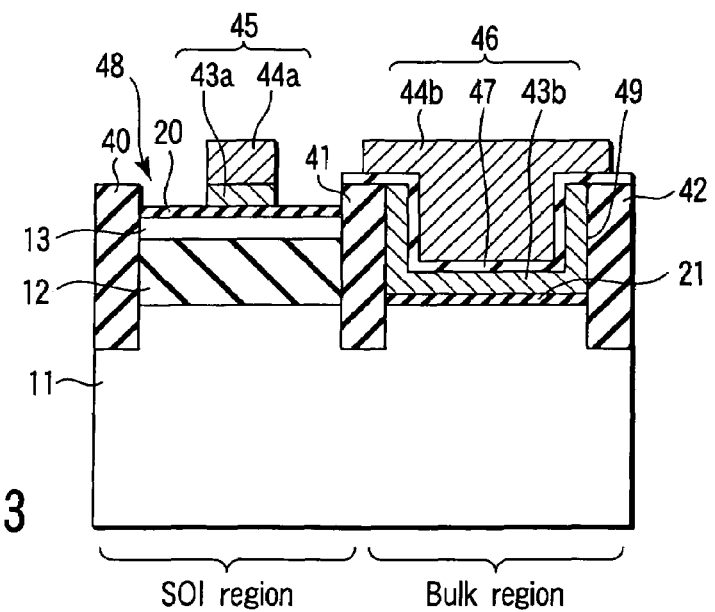
FIG. 33 is a cross sectional view showing a second example of the semiconductor device according to the second embodiment of this invention.

FIG. 33 is a cross sectional view showing the second example of a semiconductor device according to the second embodiment of this invention. In this case, the structure which is different from that of the first example is mainly explained.

As shown in FIG. 33, in the second example of the second embodiment, an insulating film 47 such as an ONO (Oxide Nitride Oxide) film is formed between the upper electrode layer 44b and the lower electrode layer 43b in the bulk region. That is, an EEPROM cell having the lower electrode layer 43b used as a floating gate and the upper electrode layer 44b used as a control gate is formed in the bulk region.

Further, in the second example, the structure which eliminates the difference in level between the SOI region and the bulk region is different from that of the first example. That is, the lower electrode layer 43b is formed with substantially the same thickness as the lower electrode layer 43a and the difference in level between the SOI region and the bulk region is eliminated by use of the upper electrode layer 44b and insulating film 47.

In the bulk region, the lower electrode layer 43b has side surface portions formed along the side surfaces (the side surfaces of the element isolation regions 41, 42) of the concave portion 49 and a bottom surface portion formed along the bottom surface (on the gate insulating film 21) of the concave portion 49. Further, the insulating film 47 has side surface portions formed along the side surface portions of the lower electrode layer 43b, a bottom surface portion formed along the bottom surface portion of the lower electrode layer 43b and upper portions formed along the upper surfaces of the element isolation regions 41, 42 and lower electrode layer 43b. That is, the lower electrode layer 43b and insulating film 47 in the bulk region have a concave structure formed according to the shape of the concave portion 49. Further, since the upper electrode layer 44b is formed to fill the concave portion of the concave structure formed of the lower electrode layer 43b and insulating film 47, the central portion of the upper electrode layer 44b is made thicker than the end portion thereof.

According to the second example of the second embodiment, the same effect as that of the first example of the second embodiment can be attained.

Further, in the second example, the lower electrode layer 43b and insulating film 47 in the bulk region are formed in a concave shape by use of the difference in level between the SOI region and the bulk region. Therefore, an adequate coupling ratio between the upper electrode layer 44b and the lower electrode layer 43b can be attained and thus a merit that the operation of the cell can be stabilized can be obtained.

3. Third Embodiment:

The third embodiment is an example in which a buried insulating film and SOI layer in an SOI region are used as a gate insulating film and gate electrode in a bulk region.

First and second examples of the third embodiment are explained below.

[3-1] FIRST EXAMPLE

The first example of the third embodiment shows a basic structure in which a buried insulating film and SOI layer in an SOI region are used as a gate insulating film and gate electrode in a bulk region.

Figure 34:
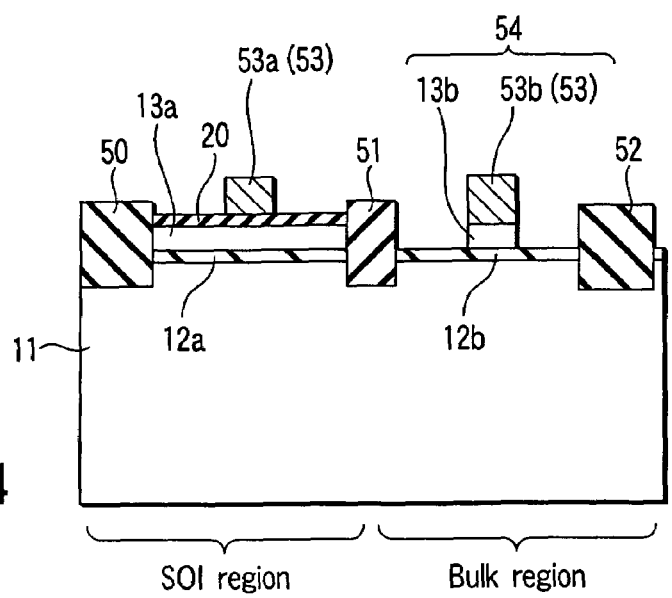
FIG. 34 is a cross sectional view showing a first example of a semiconductor device according to a third embodiment of this invention.

FIG. 34 is a cross sectional view showing the first example of a semiconductor device according to the third embodiment of this invention. As shown in FIG. 34, in the first example of the semiconductor device according to the third embodiment, a buried insulating film 12a in the SOI region is formed relatively thin and an insulating film used as the buried insulating film 12a is also used as a gate insulating film 12b in the bulk region. Further, a layer used as an SOI layer 13a in the SOI region is also used as a lower electrode layer 13b of a gate electrode 54 in the bulk region. In addition, an electrode layer used as a gate electrode in the SOI region is also used as an upper electrode layer 53b of the gate electrode 54 in the bulk region.

The heights of the substrate portions which lie under the gate electrode 53a in the SOI region and the gate electrode 54 in the bulk region are different. However, the heights of the upper surfaces of the gate electrodes 53a, 54 are set substantially equal to each other. That is, the difference in level between the substrate portions lying under the gate electrodes in the SOI region and the bulk region can be eliminated by forming the gate electrode 54 in the bulk region with a two-layered structure.

In this case, if the SOI layer 13a is formed of a single crystal silicon layer, for example, a layer (lower electrode layer 13b) which is part of the gate electrode 54 in the bulk region is formed of a single crystal silicon layer.

Figure 35:
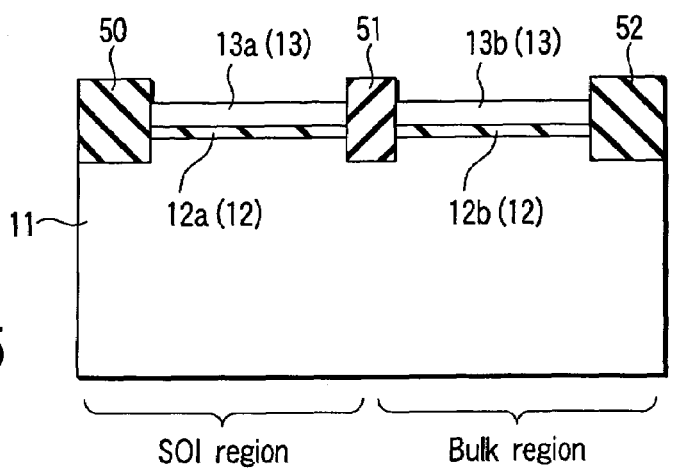
FIGS. 35, 36 are cross sectional views showing the manufacturing steps of the first example of the semiconductor device according to the third embodiment of this invention.
Figure 36:
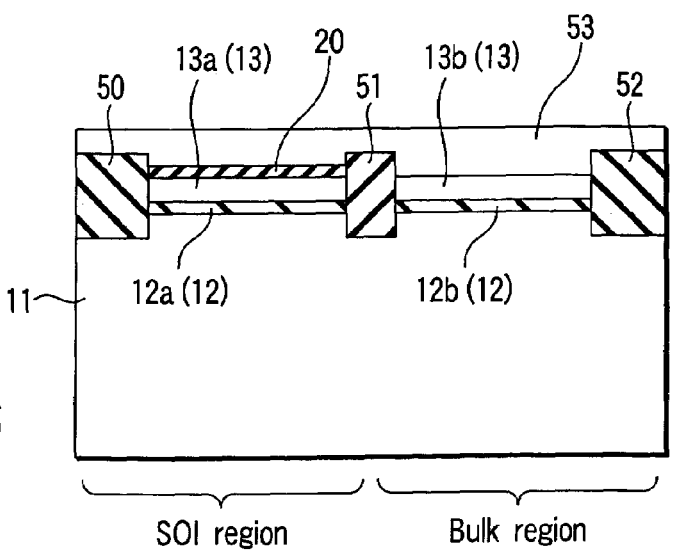

FIGS. 35, 36 are cross sectional views showing the manufacturing steps of the first example of the semiconductor device according to the third embodiment of this invention. The manufacturing method of the first example of the third embodiment is explained below.

First, as shown in FIG. 35, an SOI wafer having a supporting substrate 11, buried insulating film 12 and SOI layer 13 is prepared. Then, element isolation regions 50, 51, 52 are formed to extend from the surface of the SOI layer 13 into the supporting substrate 11. As a result, a buried insulating film 12a and SOI layer 13a are formed in the SOI region. In the bulk region, a gate insulating film 12b formed of the buried insulating film 12 is formed and a lower electrode layer 13b for the gate electrode which is formed of the SOI layer 13 is formed.

Next, as shown in FIG. 36, a gate insulating film 20 is formed on the SOI layer 13a in the SOI region. After this, an electrode member 53 is formed on the entire surface.

Then, as shown in FIG. 34, the electrode member 53 and lower electrode layer 13b are simultaneously processed. As a result, a gate electrode 53a formed of the electrode member 53 is formed in the SOI region. Further, a gate electrode 54 of the two-layered structure having the lower electrode layer 13b and an upper electrode layer 53b formed of the electrode member 53 is formed in the bulk region.

According to the first example of the third embodiment, the following effects can be attained.

(1) In the first example of the third embodiment, since the selective epitaxial growth process is not performed in the bulk region, it is not necessary to form a mask member used at the time of epitaxial growth on the side surface of the SOI layer 13. Therefore, since the concave portion 160 caused by removing the mask member is not formed, it is not necessary to form a large element isolation region which is used to remove the concave portion 160. As a result, a space of the element isolation region 51 in the boundary portion between the SOI region and the bulk region can be reduced.

(2) In the prior art, there may occur a possibility that a difference in level between the SOI layer 13 and the epitaxial layer 17 occurs due to a variation in the film thickness of the selective growing films formed at the time of epitaxial growth. If a gate electrode is formed with the difference in level kept un-eliminated, it becomes impossible to form gate electrodes of the same height in the SOI region and bulk region.

On the other hand, in the first example of the third embodiment, since the selective epitaxial growth process is not performed in the bulk region, a difference in level occurs between the SOI region and the bulk region. However, the difference in level can be eliminated by forming the gate electrode 54 in the bulk region in a two-layered structure form. Therefore, the gate electrodes 53a, 54 of the same height can be formed in the SOI region and bulk region.

(3) In the first example of the third embodiment, the material layer used to form the buried insulating film 12a, SOI layer 13a and gate electrode 53a in the SOI region is also used as the material layer to form the gate insulating film 12b and the lower electrode layer 13b and upper electrode layer 53b of the gate electrode 54 in the bulk region. Therefore, the process can be simplified since it is not necessary to additionally provide a new step when elements in the bulk region are formed.

(4) In the first example of the third embodiment, the buried insulating film 12a in the SOI region is used as the gate insulating film 12b in the bulk region and the SOI layer 13a in the SOI region is used as the gate electrode (lower electrode layer 13b) in the bulk region. In this case, if the SOI layer 13 in this embodiment is formed of single crystal silicon, grains occurring when the layer is formed of polycrystalline silicon are not formed. Therefore, a problem associated with the grains can be solved in the present embodiment. For example, it becomes possible to form a gate insulating film with uniform film thickness, prevent a lowering in the withstand voltage from the microscopic viewpoint and further reduce the film thickness. Further, the gate electrode of single crystal silicon has lower wiring resistance than the gate electrode of polycrystalline silicon.

[3-2] SECOND EXAMPLE

The second example of the third embodiment is attained by adding an EEPROM in the bulk region of the first example.

Figure 37:
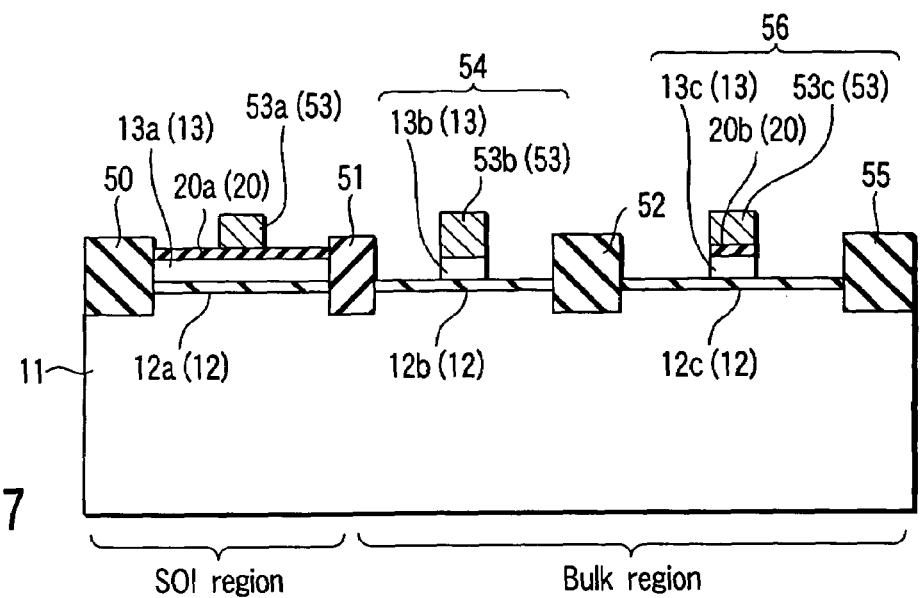
FIG. 37 is a cross sectional view showing a second example of the semiconductor device according to the third embodiment of this invention.

FIG. 37 is a cross sectional view showing the second example of a semiconductor device according to the third embodiment of this invention. As shown in FIG. 37, in the second example of the semiconductor device according to the third embodiment, a gate electrode layer 53a with the single-layered structure is formed in the SOI region and a gate electrode 54 with the two-layered structure and a gate electrode 56 of the EEPROM are formed in the bulk region.

In the EEPROM of the bulk region, a gate insulating film 12c is formed of the same film 12 as buried insulating films 12a, 12b. Further, a lower electrode layer 13c functioning as a floating gate is formed of the same layer 13 as an SOI layer 13a and lower electrode layer 13b and an insulating film 20b is formed of the same film 20 as a gate insulating film 20a. In addition, an upper electrode layer 53c functioning as a control gate is formed of the same layer 53 as a gate electrode 53a and upper electrode layer 53b.

The heights of the substrate portions which lie under the gate electrode 53a in the SOI region and the gate electrodes 54, 56 in the bulk region are different. However, the heights of the upper surfaces of the gate electrodes 53a, 54, 56 are set substantially equal to each other. That is, the difference in level between the substrate portions lying under the gate electrodes in the SOI region and the bulk region can be eliminated by forming the gate electrodes 54, 56 with a two-layered structure in the bulk region.

The same effect as that of the first example of the third embodiment can be attained according to the second example of the third embodiment.

Further, when an EEPROM is formed in the bulk region, the gate insulating film 12c, lower gate electrode 13c, insulating film 20b and upper electrode layer 53c are respectively formed by use of the same layers as the buried insulating film 12a, SOI layer 13a, gate insulating film 20a and gate electrode 53a. Therefore, the process can be simplified since it is not necessary to additionally provide a new step of forming an EEPROM in the bulk region.

Further, the present invention is not limited to the above embodiments and can be variously modified as described below, for example, without departing from the technical scope thereof when embodying the present invention.

(1) The final removing method for the buried insulating film 12 in the bulk region is not limited to the wet etching process. For example, it is possible to use a method for further removing a damage layer caused in the supporting substrate 11 after the buried insulating film 12 is removed by use of the RIE process.

(2) The space portion 15 formed by setting back the SOI layer 13 is filled with the second mask member 16. However, a step of filling the second mask member 16 into the space portion can be omitted.

In this case, there occurs a possibility that a film is grown in an epitaxial fashion from the setback side surface of the SOI layer 13 at the time of formation of the epitaxial layer 17. At this time, the SOI layer 13 and epitaxial layer 17 can be prevented from being connected to each other by increasing the setback amount (the width of the space portion 15) of the side surface of the SOI layer 13.

Further, regions having different setback amounts are formed by use of a resist process and the insulating region and conducting region explained in the second example of the first embodiment can be separately formed only according to the degree of setback amounts.

Further, if no material is filled in the space portion 15, a difference in level corresponding to the film thickness of the SOI layer 13 occurs on the buried insulating film 12 near the boundary of the insulating region. However, the difference does not cause any problem if the SOI layer 13 is a sufficiently thin film.

Figure 38:
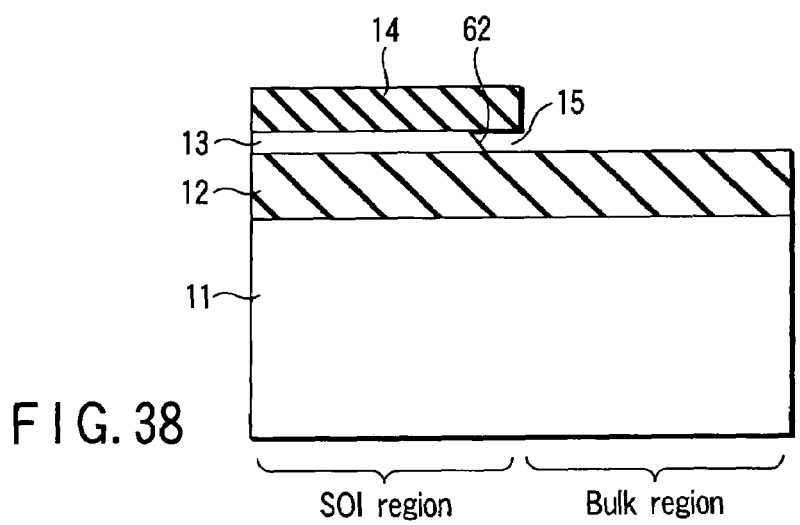
FIGS. 38, 39 are cross sectional views each showing a semiconductor device having a forwardly tapered portion according to each embodiment of this invention.

(3) The space portion 15 can be formed as follows. First, as shown in FIG. 38, a first mask member 14 is patterned by use of the RIE process. Then, the SOI layer 13 is removed by use of the isotropic etching process to form a space portion 15. At this time, as the isotropic etching process, for example, a dry etching process by CDE, a wet etching process by use of a KOH solution or the like is used. Therefore, in this case, since a forwardly tapered surface 62 is formed on the side surface of the SOI layer 13, a possibility that a problem caused by a film residue occurs in film formation can be further suppressed. Then, after the space portion 15 is formed, the buried insulating film 12 in the bulk region is etched by the RIE process and wet etching process. After this, a process in which no material is filled into the space portion 15 is performed and a structure as shown in FIG. 39 or 40 is completed.

Figure 39:
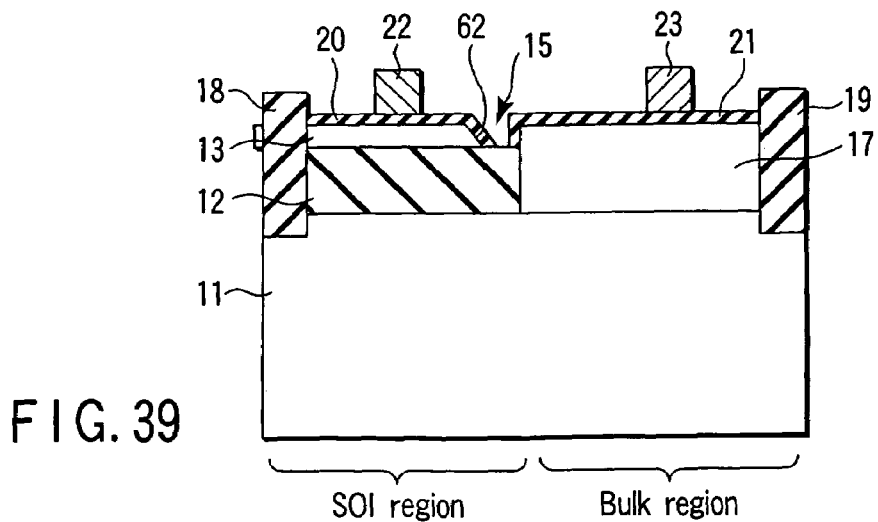
Figure 40:
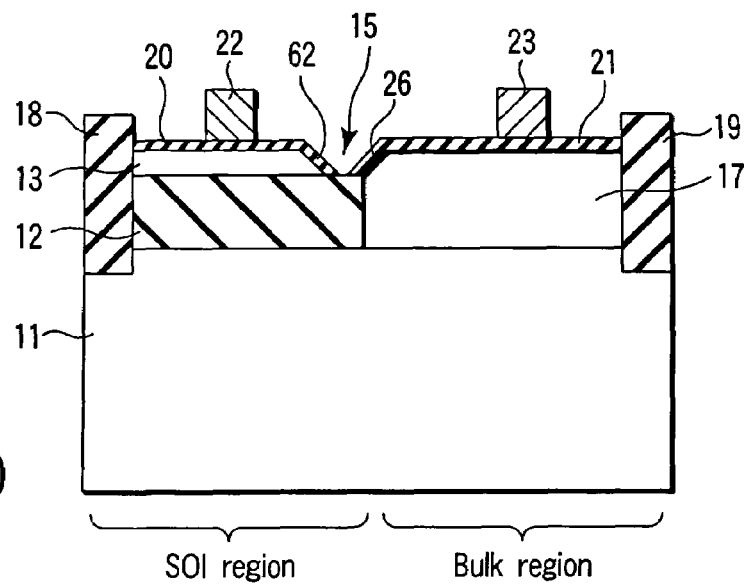
FIG. 40 is a cross sectional view showing a semiconductor device having a forwardly tapered portion and facet according to each embodiment of this invention.
Figure 41:
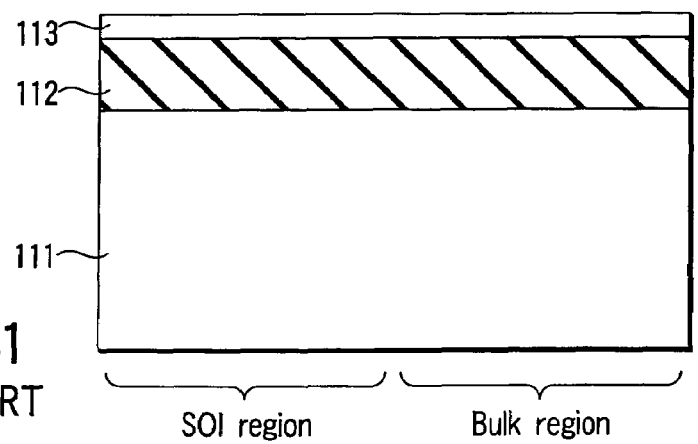
FIGS. 41 to 47 are cross sectional views showing the manufacturing steps of a conventional semiconductor device.
Figure 42:
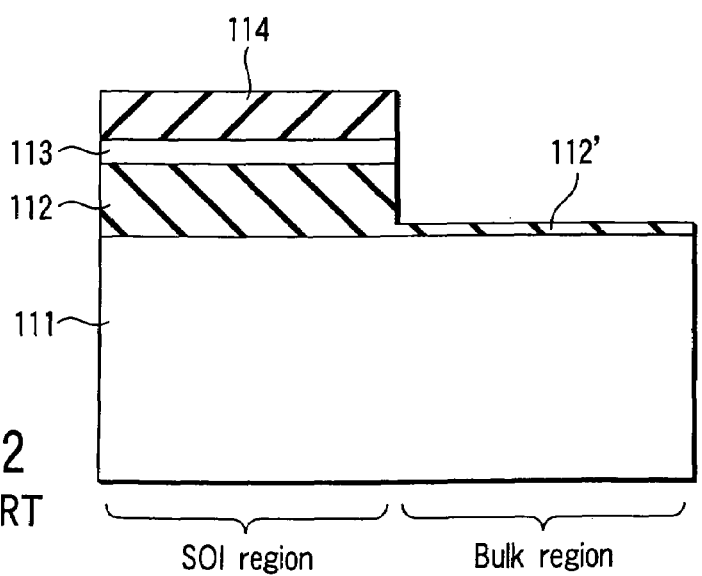
Figure 43:
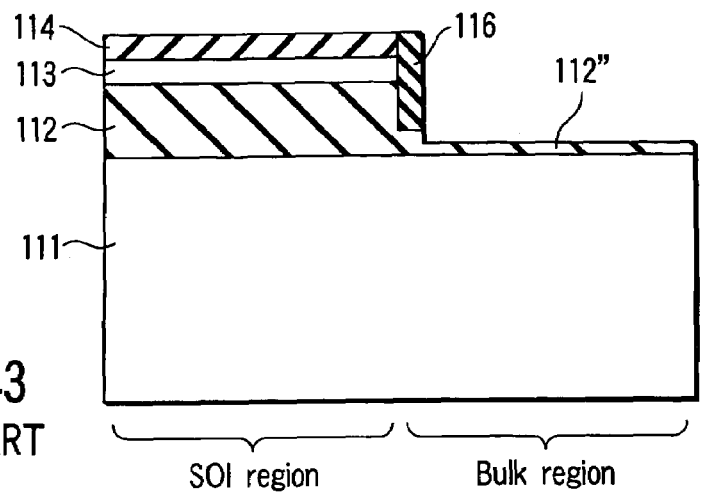

FIG. 39 shows a structure when no facet is formed on the epitaxial layer 17 and FIG. 40 shows a structure when a facet 26 is formed on the epitaxial layer 17.

When the forwardly tapered surface 62 is formed on the side surface of the SOI layer 13, there occurs no problem if the space portion 15 is filled with the second mask member 16.

(4) The element isolation region 16a is formed after the SOI layer 13 and buried insulating film 12 in the bulk region are removed, but this is not limitative. For example, it is possible to remove the SOI layer 13 and buried insulating film 12 in the bulk region after the element isolation region 16a is formed at least in the boundary portion between the SOI region and the bulk region. After this, an epitaxial growth process may be performed.

(5) Various materials and crystallinities applied to formation of a device can be applied as the materials and crystallinities of the SOI layer 13, buried insulating film 12, supporting substrate 11, mask members 14, 16 and epitaxial layer 17.

(6) The upper surface of the element isolation region 16a is set at substantially the same height as the upper surfaces of the SOI layer 13 and epitaxial layer 17, but this is not limitative. However, the upper surface of the element isolation region 16a can be set somewhat higher or lower than the upper surfaces of the SOI layer 13 and epitaxial layer 17. For example, if the element isolation region 16a is formed of an oxide film, the upper surface of the element isolation region 16a can be set somewhat lower than the upper surfaces of the SOI layer 13 and epitaxial layer 17 by the oxide film removing process. Further, if the element isolation region 16a is formed of a nitride film, the height of the upper surface of the element isolation region 16a is kept unchanged by the oxidation process or oxide film removing process. However, in this case, the upper surfaces of the SOI layer 13 and epitaxial layer 17 may be lowered by the oxidation process or oxide film removing process. As a result, the upper surface of the element isolation region 16a can be set higher than the upper surfaces of the SOI layer 13 and epitaxial layer 17.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a substrate having first and second regions,
   a first insulating film formed on the substrate in the first region,
   an epitaxial layer formed on the substrate in the second region with a first space provided with respect to the first insulating film and having an upper surface higher than an upper surface of the first insulating film,
   a semiconductor layer having a first portion formed on the first insulating film and a second portion which projects from a side surface of the first insulating film on the epitaxial layer side and formed with a second space provided with respect to the epitaxial layer, upper surfaces of the first and second portions being set at substantially the same height as the upper surface of the epitaxial layer, and
   an element isolation insulating film formed in the first and second spaces and having an upper surface set at substantially the same height as the upper surface of the epitaxial layer and the upper surfaces of the first and second portions.

2. A semiconductor device comprising:
   a substrate having first and second regions,
   a first insulating film formed on the substrate in the first region,
   an epitaxial layer formed on the substrate in the second region with a first space provided with respect to the first insulating film and having an upper surface higher than an upper surface of the first insulating film,
   a semiconductor layer formed on the first insulating film with a second space larger than the first space provided with respect to the epitaxial layer and having an upper surface set at substantially the same height as the upper surface of the epitaxial layer, and
   an element isolation insulating film formed in the first and second spaces and having an upper surface set at substantially the same height as the upper surface of the epitaxial layer and the upper surface of the semiconductor layer.

3. The semiconductor device according to claim 1, wherein the element isolation insulating film is formed of a silicon nitride film.

* * * * *